(12) United States Patent
Choi et al.

(10) Patent No.: US 10,734,705 B2
(45) Date of Patent: Aug. 4, 2020

(54) ANTENNA DEVICE, AND ELECTRONIC DEVICE COMPRISING SAME

(71) Applicant: Samsung Electronics Co., Ltd., Gyeonggi-do (KR)

(72) Inventors: Youngsik Choi, Gyeonggi-do (KR); Hosaeng Kim, Gyeonggi-do (KR); Sangyoun Lee, Gyeonggi-do (KR); Seungnyun Kim, Incheon (KR); Dongil Son, Gyeonggi-do (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 83 days.

(21) Appl. No.: 16/070,569

(22) PCT Filed: Jan. 17, 2017

(86) PCT No.: PCT/KR2017/000564
§ 371 (c)(1),
(2) Date: Jul. 17, 2018

(87) PCT Pub. No.: WO2017/126863
PCT Pub. Date: Jul. 27, 2017

(65) Prior Publication Data
US 2019/0027807 A1 Jan. 24, 2019

(30) Foreign Application Priority Data
Jan. 21, 2016 (KR) .................. 10-2016-0007704

(51) Int. Cl.
H01Q 1/24 (2006.01)
H01Q 1/38 (2006.01)
(Continued)

(52) U.S. Cl.
CPC ............... H01Q 1/24 (2013.01); G06F 3/041 (2013.01); H01Q 1/243 (2013.01); H01Q 1/38 (2013.01);
(Continued)

(58) Field of Classification Search
CPC ........... H01Q 1/24; H01Q 1/38; G06F 3/041; H04M 1/02; H05K 5/03
See application file for complete search history.

(56) References Cited

U.S. PATENT DOCUMENTS 8,466,839 B2   6/2013  Schlub et al.
9,024,823 B2*  5/2015  Bevelacqua ............. H01Q 9/42
                       (Continued)

FOREIGN PATENT DOCUMENTS

EP        2 879 232 A1     6/2015
KR    10-2012-0045955 A    5/2012
                (Continued)

OTHER PUBLICATIONS

European Search Report dated Apr. 15, 2019.
European Search Report dated Dec. 21, 2018.

Primary Examiner — Dameon E Levi
Assistant Examiner — David E Lotter
(74) Attorney, Agent, or Firm — Cha & Reiter, LLC.

(57) ABSTRACT

An electronic device may comprise: a housing comprising a first plate which faces a first direction and a second plate which faces a second direction opposite to the first direction, the housing having a space formed between the first plate and the second plate; a side member which surrounds at least a part of the space; a display which is disposed inside the housing and is exposed through the first plate; a printed circuit board which is disposed inside the housing and is disposed between the display and the second plate; and a communication module which is disposed inside the hous-
(Continued)

ing and is coupled to the printed circuit board. The side member may comprise: a first conductive member which extends around the space; a second conductive member which extends around the space so as to be in parallel with the first conductive member, wherein the first conductive member is spaced from the second conductive member, the second conductive member is more adjacent to the second plate than the first conductive member, and the second conductive member has at least a part which is electrically connected to the communication module; and a first insulating member which extends around the space so as to be in parallel with the first conductive member and is disposed between the first conductive member and the second conductive member. In addition, other various embodiments are possible.

12 Claims, 68 Drawing Sheets

(51) Int. Cl.

| | | |
|---|---|---|
| *H04M 1/02* | (2006.01) | |
| *H05K 5/03* | (2006.01) | |
| *H05K 5/00* | (2006.01) | |
| *H01Q 5/378* | (2015.01) | |
| *G06F 3/041* | (2006.01) | |

(52) U.S. Cl.
CPC .............. *H01Q 5/378* (2015.01); *H04M 1/02* (2013.01); *H05K 5/00* (2013.01); *H05K 5/03* (2013.01)

(56) References Cited

U.S. PATENT DOCUMENTS

| | | |
|---|---|---|
| 2012/0105287 A1 | 5/2012 | Jung et al. |
| 2012/0299785 A1 | 11/2012 | Bevelacqua |
| 2013/0318766 A1 | 12/2013 | Kiple et al. |
| 2014/0228080 A1 | 8/2014 | Choi et al. |
| 2015/0147984 A1 | 5/2015 | Ying et al. |
| 2015/0188215 A1 | 7/2015 | Jarvis |
| 2015/0372372 A1 | 12/2015 | Lee et al. |
| 2016/0013543 A1 | 1/2016 | Nguyen |

FOREIGN PATENT DOCUMENTS

| | | |
|---|---|---|
| KR | 10-2012-0119834 A | 10/2012 |
| KR | 10-2012-0133368 A | 12/2012 |
| KR | 10-2014-0101240 A | 8/2014 |
| KR | 10-2015-0044946 A | 4/2015 |
| KR | 10-1537466 B1 | 7/2015 |
| KR | 10-2016-0001049 A | 1/2016 |

\* cited by examiner

ANTENNA DEVICE, AND ELECTRONIC DEVICE COMPRISING SAME

CLAIM OF PRIORITY

This application is a National Phase Entry of PCT International Application No. PCT/KR2017/000564, which was filed on Jan. 17, 2017 and claims a priority to Korean Patent Application No. 10-2016-0007704, which was filed on Jan. 21, 2016, the contents of which are incorporated herein by reference.

TECHNICAL FIELD

Various embodiments of the present invention relate to an antenna device and an electronic device including the same.

BACKGROUND ART

Nowadays, with the development of digital technology, various electronic devices capable of processing communication and personal information while moving, such as a mobile communication terminal, personal digital assistant (PDA), electronic organizer, smart phone, and tablet personal computer (PC), have been released. The electronic devices are in a mobile convergence step that can perform functions of other terminals as well as the original functions thereof. Typically, the electronic device may have a communication function such as audio dedicated communication and audiovisual communication, a message transmission and reception function such as a short message service (SMS)/multimedia message service (MMS) and an e-mail, electronic organizer function, photographing function, broadcast reproduction function, moving picture reproduction function, music reproduction function, Internet function, messenger function, and social networking service (SNS) function. As a user would like to view various contents with a larger screen than that of a conventional device, a display area increases; and, in order to enhance the aesthetic sense, a display is disposed at an entire front surface of the electronic device.

DISCLOSURE OF INVENTION

Technical Problem

When a display having an extended size is disposed at a front surface of an electronic device, a distance between an antenna and a display disposed at the side of the electronic device, for example an outer area of the electronic device, reduces; thus, a performance of the antenna may be deteriorated by the display.

An antenna device and an electronic device including the same according to various embodiments of the present invention tend to maintain an antenna performance while reducing the effect of an extended display.

Solution to Problem

In a method according to various embodiments for solving the above problems or other problems, for example, an electronic device includes a housing including a first plate advancing in a first direction and a second plate advancing in a second direction opposite to the first direction and configured to form a space between the first plate and the second plate; a side member configured to enclose at least a portion of the space; a display disposed within the housing and exposed through the first plate; a printed circuit board (PCB) disposed within the housing and disposed between the display and the second plate; and a communication module disposed within the housing and coupled to the PCB, wherein the side member includes a first conductive member extended to a periphery of the space; a second conductive member extended to a periphery of the space in parallel to the first conductive member, wherein the first conductive member is spaced apart from the second conductive member, the second conductive member is adjacent to the second plate rather than the first conductive member, and at least a portion of the second conductive member is electrically connected to the communication module; and a first insulating member extended to a periphery of the space in parallel to the first conductive member and disposed between the first conductive member and the second conductive member.

A method of processing a housing of an electronic device according to various embodiments includes processing at least one base material; bonding a surface of the at least one base material; insert molding an injection member into the bonded base material; processing the injected base material; and post-processing the processed injected base material.

An electronic device according to various embodiments includes a display exposed at a first surface of the outside of the electronic device; a PCB disposed within the electronic device between the display and a rear case and in which a communication module is disposed; a housing configured to form a space between the display and the rear case; and a side member configured to enclose at least a portion of the space, wherein the side member includes a first conductive member extended to a periphery of the space; a second conductive member extended to a periphery of the space in parallel to the first conductive member, wherein the first conductive member is spaced apart from the second conductive member, and the second conductive member is adjacent to the second plate rather than the first conductive member, and at least a portion of the second conductive member is electrically connected to the communication module; and a first insulating member extended to a periphery of the space in parallel to the first conductive member and disposed between the first conductive member and the second conductive member.

Advantageous Effects of Invention

In an antenna device and an electronic device including the same according to various embodiments of the present invention, by enabling an antenna to have unity through a processing while securing an antenna performance by reducing the effect of an extended display, the aesthetic sense can be enhanced.

MODE FOR THE INVENTION

Figure 1:
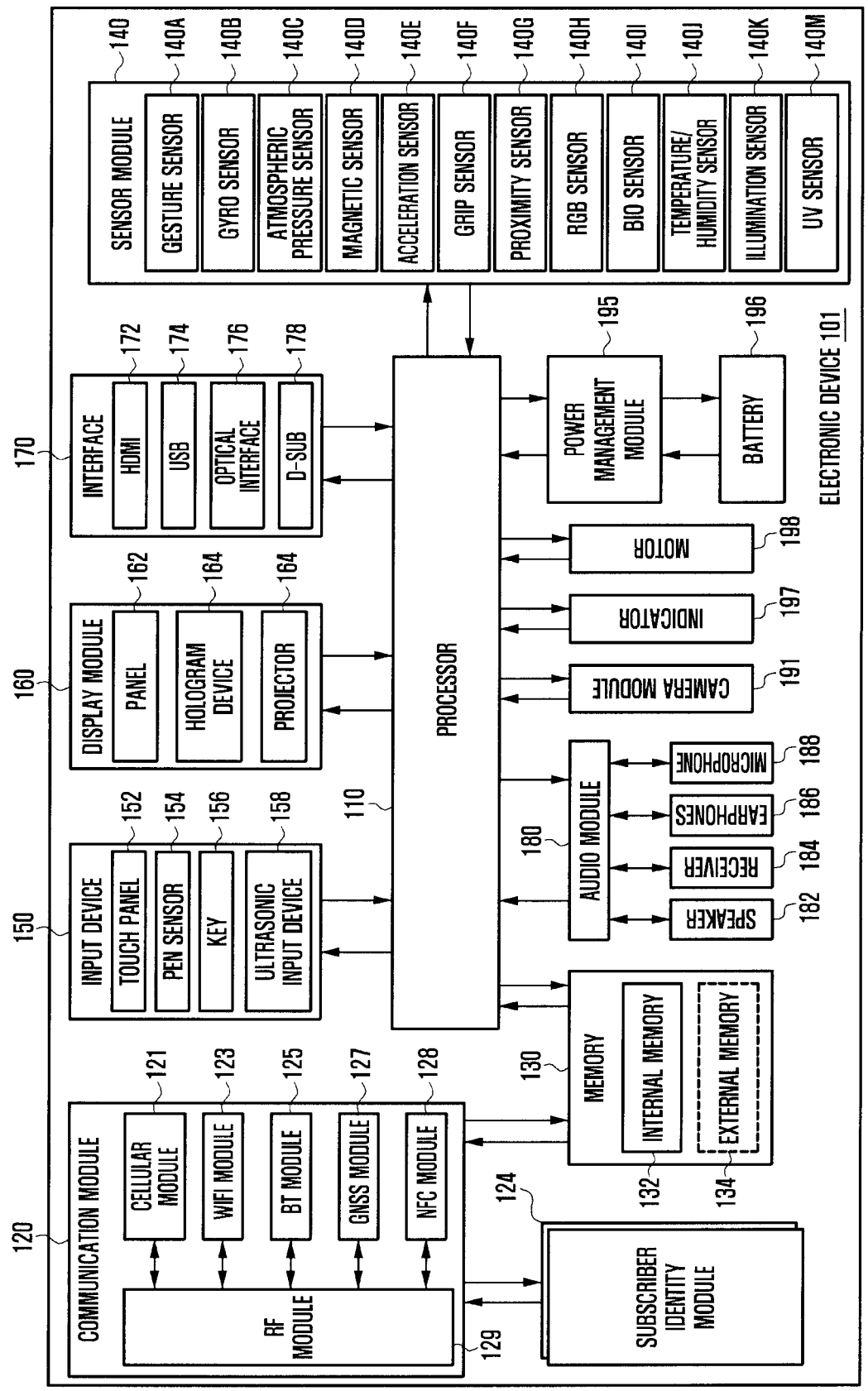
FIG. 1 is a block diagram illustrating a configuration of an electronic device in a network environment according to various embodiments of the present invention.

Hereinafter, various embodiments of this document will be described with reference to the accompanying drawings. However, it should be understood that technology described in this document is not limited to a specific embodiment and includes various modifications, equivalents, and/or alternatives of an embodiment of this document. The same reference numbers are used throughout the drawings to refer to the same or like parts.

In this document, an expression such as "have," "may have," "comprise," or "may comprise" indicates existence of a corresponding characteristic (e.g., constituent element such as a numerical value, function, operation, or component) and does not exclude the presence of another characteristic.

In this document, an expression such as "A or B", "at least one of A or/and B", or "one or more of A or/and B" may include all possible combinations of together listed items. For example, "A or B," "at least one of A and B," or "one or more of A or B" may indicate all of (1) a case of including at least one A, (2) a case of including at least one B, and (3) a case of including both at least one A and at least one B.

An expression such as "first" and "second" used in this document may indicate various constituent elements regardless of order and/or importance, is used for distinguishing a constituent element from another constituent element, and does not limit corresponding constituent elements. For example, a first user device and a second user device may represent another user device regardless of order and/or importance. For example, a first constituent element may be referred to as a second constituent element without deviating from the scope described in this document and, similarly, a second constituent element may be referred to as a first constituent element.

When it is described that a constituent element (e.g., a first constituent element) is "(operatively or communicatively) coupled with/to" or is "connected to" another constituent element (e.g., a second constituent element), it should be understood that the constituent element may be directly connected to the another constituent element or may be connected to the another constituent element through another constituent element (e.g., a third constituent element). However, when it is described that a constituent element (e.g., a first constituent element) is "directly connected" or is "directly accessed" to another constituent element (e.g., a second constituent element), it may be understood that another constituent element (e.g., a third constituent element) does not exist between the constituent element and the other constituent element.

An expression "configured to" used in this document may be interchangeably used with, for example, "suitable for", "having the capacity to", "designed to", "adapted to", "made to", or "capable of" according to a situation. A term "configured to" does not always mean "specifically designed to" in hardware. Alternatively, in any situation, an expression "device configured to" may mean that the device is "capable of" being configured together with another device or component. For example, a "processor configured to perform phrases A, B, and C" may be a generic-purpose processor (e.g., CPU or application processor) that executes an exclusive processor (e.g., an embedded processor) for performing a corresponding operation or at least one software program stored at a memory device to perform a corresponding operation.

Terms used in this document are used for describing a specific embodiment and do not limit a range of another embodiment. Unless the context otherwise clearly indicates, words used in the singular include the plural, and the plural includes the singular. Terms used here including a technical or scientific term have the same meaning as that which may be generally understood by a person of common skill in the art. Terms defined in a general dictionary among terms used in this document may be analyzed as the same meaning as or a meaning similar to that in a context of related technology, and unless it is clearly defined in this document, the term is not analyzed as having an ideal or excessively formal meaning. In some cases, a term defined in this document cannot be analyzed to exclude the embodiments of this document.

An electronic device according to various embodiments of this document may include at least one of, for example, a smart phone, tablet personal computer (tablet PC), mobile phone, video phone, e-book reader, desktop PC, laptop PC, netbook computer, workstation, server, personal digital assistant (PDA), portable multimedia player (PMP), moving picture experts group layer-3 (MP3) player, mobile medical device, camera, and wearable device. According to various embodiments, the wearable device may include at least one of an accessory type device (e.g., watch, ring, bracelet, ankle bracelet, necklace, glasses, contact lens), head-mounted-device (HMD), textile or clothing integral type device (e.g., electronic clothing), body attachment type device (e.g., skin pad or tattoo), and bio implanted type device (e.g., implantable circuit).

In an embodiment, the electronic device may be a home appliance. The home appliance may include at least one of, for example, a television, digital video disk (DVD) player, audio device, refrigerator, air-conditioner, cleaner, oven, microwave oven, washing machine, air cleaner, set-top box, home automation control panel, security control panel, television box (e.g., Samsung HomeSync™, AppleTV™, or Google TV™), game console (e.g., Xbox™, PlayStation™), electronic dictionary, electronic key, camcorder, and electronic frame.

In another embodiment, an electronic device may include at least one of various medical devices (e.g., various portable medical measurement devices (blood sugar measurement device, heartbeat measurement device, blood pressure measurement device, or body temperature measurement device), magnetic resonance angiography (MRA) device, magnetic resonance imaging (MRI) device, computed tomography (CT) device, scanning machine, and ultrasonic wave device), navigation device, global navigation satellite system (GNSS), event data recorder (EDR), flight data recorder (FDR), vehicle infotainment device, ship electronic equipment (e.g., ship navigation device, gyro compass), avionics, security device, vehicle head unit, industrial or home robot, automatic teller's machine (ATM) of a financial institution, point of sales (POS) of a store, and Internet of things (e.g., bulb, various sensors, electricity or gas meter, sprinkler, fire alarm, thermostat, street light, toaster, exercise mechanism, hot water tank, heater, boiler).

According to an embodiment, the electronic device may include at least one of a portion of furniture or a building/structure, electronic board, electronic signature receiving device, projector, and various measurement devices (e.g., water supply, electricity, gas, or electric wave measurement device). In various embodiments, the electronic device may be a combination of one or more of the foregoing various devices. An electronic device according to an embodiment may be a flexible electronic device. Further, the electronic device according to an embodiment of this document is not limited to the foregoing devices and may include a new electronic device according to technology development.

Hereinafter, an electronic device according various embodiments will be described with reference to the accompanying drawings. In this document, a term "user" may indicate a person using an electronic device or a device (e.g., artificial intelligence electronic device) using an electronic device.

FIG. 1 is a block diagram illustrating an electronic device 101 according to various embodiments. The electronic device 101 may include at least one processor (e.g., AP) 110, communication module 120, (subscriber identity module 124), memory 130, sensor module 140, input device 150, display 160, interface 170, audio module 180, camera module 191, power management module 195, battery 196, indicator 197, and motor 198.

By driving, for example, an operation system or an application program, the processor 110 may control a plurality of hardware or software components connected thereto and perform various data processing and calculation tasks. The processor 110 may be implemented into, for example, a system on chip (SoC). According to an embodiment, the processor 110 may further include a graphic processing unit (GPU) and/or an image signal processor. The processor 110 may include at least a portion (e.g., a cellular module 121) of constituent elements of FIG. 1. The processor 110 may load and process a command or data received from at least one of other constituent elements (e.g., a nonvolatile memory) at a volatile memory and store various data at the nonvolatile memory.

The communication module 120 may include, for example, a cellular module 121, WiFi module 123, Bluetooth (BT) module 125, global navigation satellite system (GNSS) module 127) (e.g., GPS module, Glonass module, Beidou module, or Galileo module), near field communication (NFC) module 128, and radio frequency (RF) module 129.

The cellular module 121 may provide, for example, audio dedicated communication, audiovisual communication, a text service, or an Internet service through a communication network. According to an embodiment, the cellular module 121 may perform identification and authentication of the electronic device 101 within a communication network using a subscriber identity module (e.g., subscriber identification module (SIM) card) 124. According to an embodiment, the cellular module 121 may perform at least a partial function of functions that the processor 110 may provide. According to an embodiment, the cellular module 121 may include a communication processor (CP).

The WiFi module 123, the BT module 125, the GNSS module 127, and the NFC module 128 each may include a processor for processing data transmitted and received through, for example, a corresponding module. According to an embodiment, at least some (e.g., two or more) of the cellular module 121, the WiFi module 123, the BT module 125, the GNSS module 127, and the NFC module 128 may be included in one integrated chip (IC) or an IC package.

The RF module 129 may transmit and receive, for example, a communication signal (e.g., an RF signal). The RF module 129 may include, for example, a transceiver, power amp module (PAM), frequency filter, low noise amplifier (LNA), or antenna. According to another embodiment, at least one of the cellular module 121, WiFi module 123, BT module 125, GNSS module 127, and NFC module 128 may transmit and receive an RF signal through a separate RF module.

The subscriber identity module 124 may include, for example, a card containing a subscriber identity module and/or an embedded SIM, and it may include unique identification information (e.g., an integrated circuit card identifier (ICCID)) or subscriber information (e.g., international mobile subscriber identity (IMSI)).

The memory 130 may include, for example, an internal memory 132 or an external memory 134. The internal memory 132 may include, for example, at least one of a volatile memory (e.g., a dynamic RAM (DRAM), static RAM (SRAM), or synchronous dynamic RAM (SDRAM)), non-volatile memory (e.g., one time programmable ROM (OTPROM), programmable ROM (PROM), erasable and programmable ROM(EPROM), electrically erasable and programmable ROM (EEPROM), mask ROM, flash ROM, flash memory (e.g., NAND flash or NOR flash), hard drive, and solid state drive (SSD).

The external memory 134 may include a flash drive, for example, compact flash (CF), secure digital (SD), micro-SD, mini-SD, extreme digital (xD), multi-media card (MMC), or memory stick. The external memory 134 may be functionally or physically connected to the electronic device 101 through various interfaces.

The sensor module 140 may measure, for example, a physical quantity or detect an operation state of the electronic device 101 and convert measured or detected information to an electric signal. The sensor module 140 may include at least one of, for example, a gesture sensor 140A, gyro sensor 140B, atmospheric pressure sensor 140C, magnetic sensor 140D, acceleration sensor 140E, grip sensor 140F, proximity sensor 140G, color sensor 140H (e.g., red, green, and blue (RGB) sensor), bio sensor 140I, temperature/humidity sensor 140J, illumination sensor 140K, and ultraviolet (UV) sensor 140M. Additionally or alternatively, the sensor module 140 may include, for example, an E-nose sensor, electromyography sensor (EMG sensor), electroencephalogram sensor (EEG sensor), electrocardiogram sensor (ECG sensor), infrared (IR) sensor, iris sensor, and/or fingerprint sensor. The sensor module 140 may further include a control circuit for controlling at least one sensor that belongs therein. In an embodiment, the electronic device 101 further includes a processor configured to control the sensor module 140 as a portion of the processor 110 or separately from the processor 110, and when the processor 110 is in a sleep state, the electronic device 101 may control the sensor module 140.

The input device 150 may include, for example, a touch panel 152, (digital) pen sensor 154, key 156, or ultrasonic input device 158. The touch panel 152 may use at least one method of, for example, capacitive, resistive, infrared ray, and ultrasonic wave methods. The touch panel 152 may further include a control circuit. The touch panel 152 may further include a tactile layer to provide a tactile response to a user.

The (digital) pen sensor 154 may be, for example, a portion of a touch panel or may include a separate recognition sheet. The key 156 may include, for example, a physical button, optical key, or key pad. The ultrasonic input device 158 may detect ultrasonic waves generated in an input instrument through a microphone (e.g., microphone 188) to determine data corresponding to the detected ultrasonic wave.

The display 160 may include a panel 162, a hologram device 164, or a projector 166. The panel 162 may be implemented with, for example, a flexible, transparent, or wearable method. The panel 162 and the touch panel 152 may be formed in a module. The hologram device 164 may show a stereoscopic image in the air using interference of light. The projector 166 may project light on a screen to display an image. The screen may be positioned, for example, at the inside or the outside of the electronic device 101. According to an embodiment, the display 160 may further include a control circuit that controls the panel 162, the hologram device 164, or the projector 166.

The interface 170 may include, for example, a high-definition multimedia interface (HDMI) 172, universal serial bus (USB) 174, optical interface 176, or D-subminiature (D-sub) 178. Additionally or alternatively, the interface 170 may include, for example, a mobile high-definition link (MHL) interface, a secure digital (SD) card/multi-media card (MMC) interface, or an infrared data association (IrDA) specification interface.

The audio module 180 may bilaterally convert, for example, a sound and an electric signal. The audio module 180 may process sound information that is input or output through, for example, a speaker 182, receiver 184, earphone 186, or microphone 188.

The camera module 191 may photograph, for example, a still picture and a moving picture and include at least one image sensor (e.g., a front sensor or a rear sensor), a lens, an image signal processor (ISP), or a flash (e.g., a light emitting diode (LED) or a xenon lamp) according to an embodiment.

The power management module 195 may manage power of, for example, the electronic device 101. According to an embodiment, the power management module 195 may include, for example, a power management integrated circuit (PMIC), charger integrated circuit (charge IC), battery, or fuel gauge. The PMIC may have a wire and/or wireless charge method. The wireless charge method may include, for example, a magnetic resonance method, magnetic induction method, or electromagnetic wave method and may further include an additional circuit, for example, a coil loop, resonant circuit, and rectifier for wireless charge. The battery gauge may measure, for example, a residual quantity of the battery 196, a voltage, a current, or a temperature while charging. The battery 196 may include, for example, a rechargeable battery or a solar battery.

The indicator 197 may display a specific state, for example, a booting state, a message state, or a charge state of the electronic device 101 or a portion (e.g., the processor 110) thereof. The motor 198 may convert an electric signal to a mechanical vibration and generate a vibration or a haptic effect. Although not shown, the electronic device 101 may include a processing device (e.g., GPU) for supporting a mobile TV. The processing device for supporting the mobile TV may process media data according to a specification such as digital multimedia broadcasting (DMB), digital video broadcasting (DVB), or mediaFlo™.

The elements each described in this document may be configured with at least one component, and a name of a corresponding element may be changed according to a kind of the electronic device. In various embodiments, the electronic device may include at least one of the elements described in this document and may omit some elements or may further include additional other elements. Further, as some of the elements of an electronic device according to various embodiments are coupled to form an entity, the entity may equally perform a function of corresponding elements before coupling.

Figure 2:
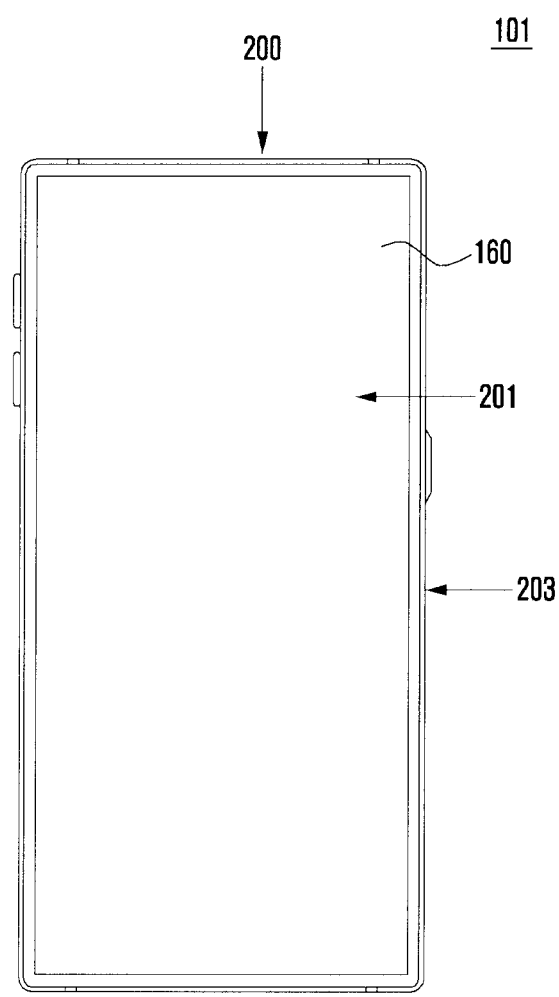
FIG. 2 is a front view of an electronic device according to various embodiments of the present invention.
Figure 3:
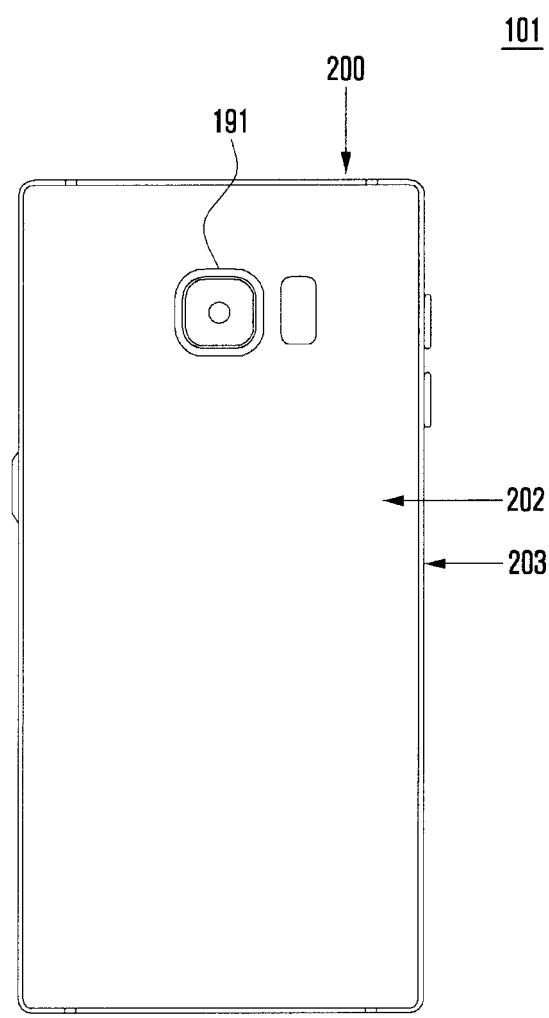
FIG. 3 is a rear view of an electronic device according to various embodiments of the present invention.

FIG. 2 is a front view of an electronic device 101 according to various embodiments of the present invention, and FIG. 3 is a rear view of an electronic device 101 according to various embodiments of the present invention.

According to various embodiments, the electronic device 101 may include a housing 200. The housing 200 may include a first plate 201 in a first direction, for example, a front direction. The housing 200 may include a second plate 202 in a second direction, for example, a rear direction. When the first plate 201 and the second plate 202 are disposed at the opposite side, the first plate 201 and the second plate 202 may be spaced at regular intervals to form a space therebetween.

According to various embodiments, a side member 203 may enclose at least a portion of the space. The side member 203 may enclose at least a portion of the first plate 201 and the second plate 202 to configure the housing 200. The key 156 or a button may be included in at least a portion of the side member 203. The display 160 may be disposed in at least a portion of the first plate 201. The display 160 may be disposed in at least a portion of the housing 200. The camera module 191 may be disposed in at least a portion of the second plate 202. The camera module 191 may be disposed in at least a portion of the housing 200.

Figure 4:
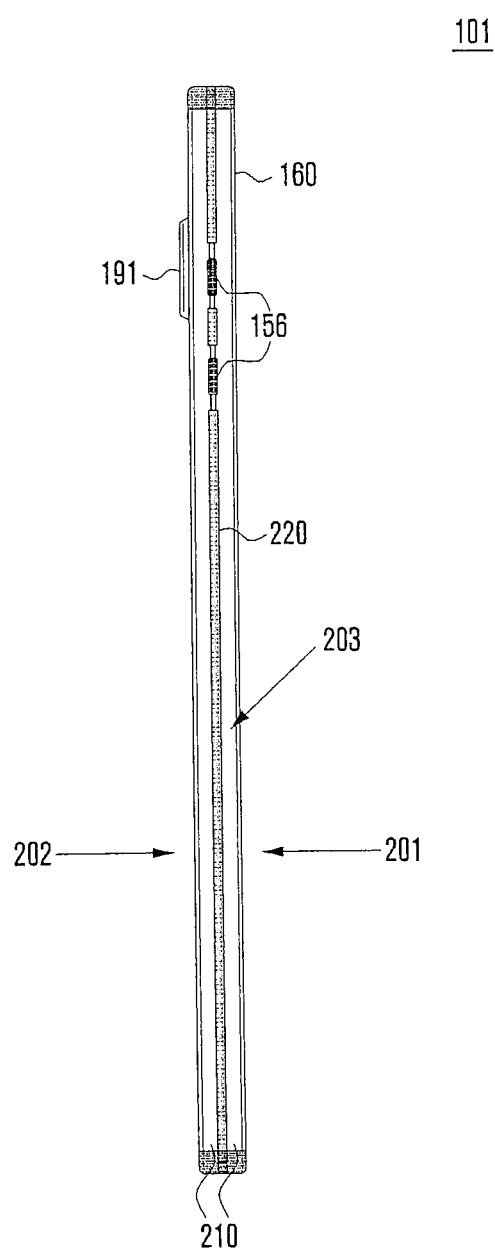
FIG. 4 is a left side view of an electronic device according to various embodiments of the present invention.
Figure 5:
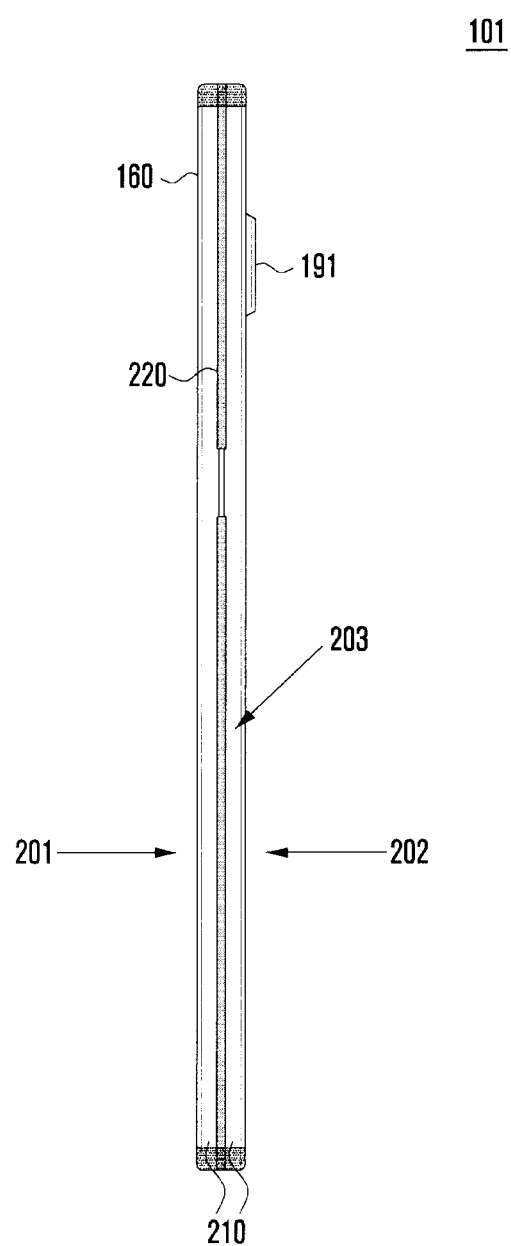
FIG. 5 is a right side view of an electronic device according to various embodiments of the present invention.
Figure 6A:
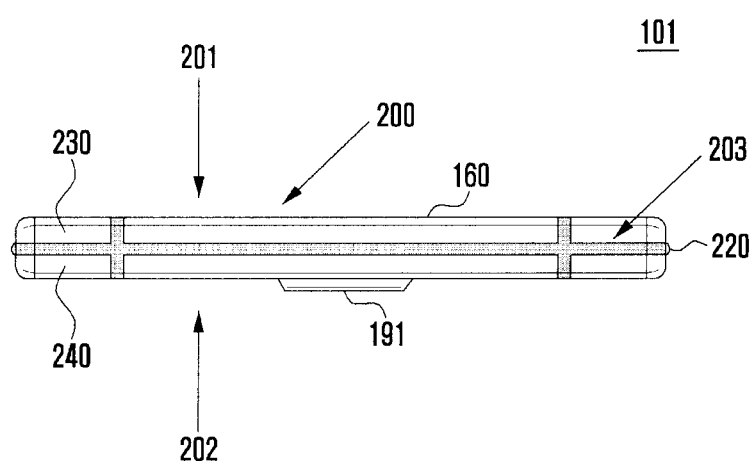
FIG. 6A is an upper side view of an electronic device according to various embodiments of the present invention.
Figure 6B:
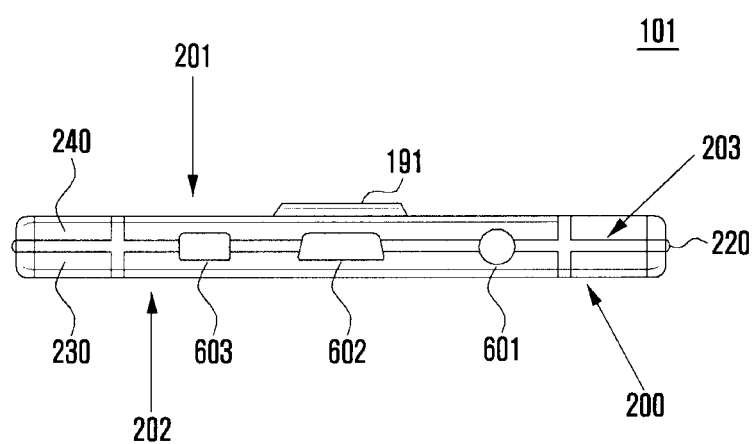
FIG. 6B is a lower side view of an electronic device according to various embodiments of the present invention.

FIG. 4 is a left side view of an electronic device 101 according to various embodiments of the present invention, FIG. 5 is a right side view of the electronic device 101 according to various embodiments of the present invention, and FIG. 6A is an upper side view of an electronic device 101 according to various embodiments of the present invention. FIG. 6B is a lower side view of an electronic device 101 according to various embodiments of the present invention.

According to various embodiments, the side member 203 may include at least one conductive member 210 and an insulating member 220.

According to various embodiments, the at least one conductive member 210 may be extended to a periphery of a space formed by the first plate 201 and the second plate 202. The at least one conductive member 210 may be formed along the side member 203. Each of the plurality of conductive members 210 may be disposed separated from each other on the side member 203. Each of the plurality of conductive members 210 may be disposed in parallel to each other on the side member 203. At least one of the plurality of conductive members 210 may be disposed close to the first plate 201, and at least one of the plurality of conductive members 210 may be disposed close to the second plate 202. The at least one conductive member 210 disposed close to the second plate 202 may be electrically connected to the communications module 120. The conductive member 210 close to a display direction 201 among the conductive members 210 may be electrically insulated, and the conductive member 210 close to a second plate direction 202 may be connected to the communication module 120 to be used as an antenna.

According to various embodiments, the electronic device 101 may include a key 156 in at least a portion of the side member 203. When the key 156 is positioned at a portion of the insulating member 220, at least a portion of the key 156 may be made of an insulating material.

According to various embodiments, the insulating member 220 may be extended to a periphery of a space formed by the first plate 201 and the second plate 202. The insulating member 220 may be formed along the side member 203. The insulating member 220 may be disposed in parallel to at least one conductive member 210 on the side member 203. The insulating member 220 may separate each of the plurality of conductive members 210. At least one conductive member 210 and the insulating member 220 may be disposed to come in close contact with each other in parallel to each other.

According to various embodiments, the electronic device 101 may include at least one of an earjack hole 601, speaker hole 602, and wire connecting portion 603. The wire connection portion 603 may be the same as that of the interface 170 of FIG. 2.

Figure 7:
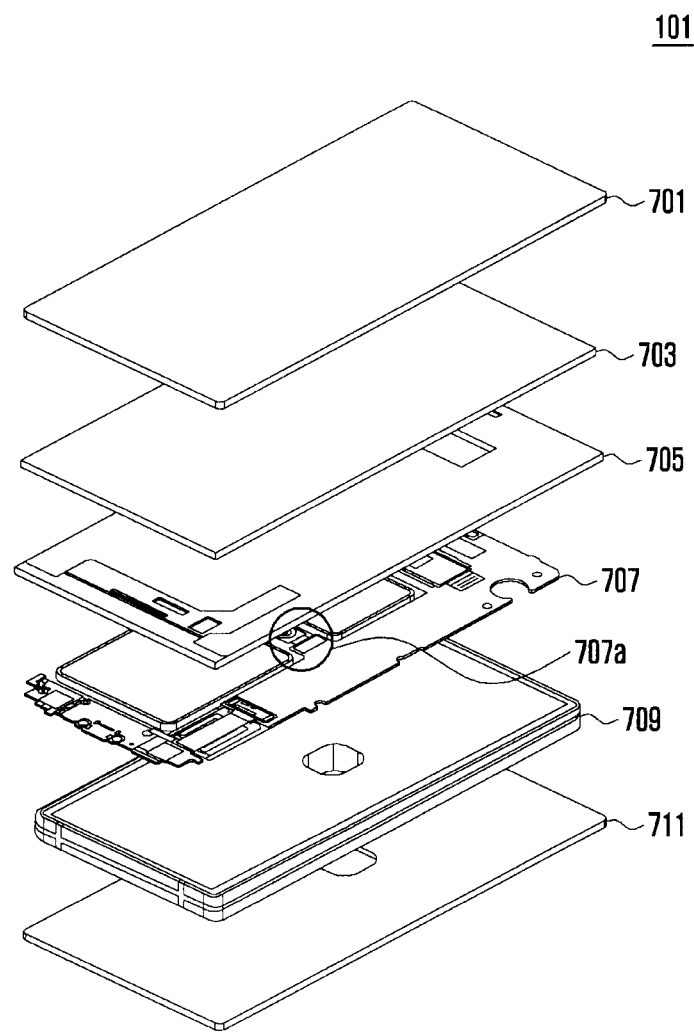
FIG. 7 is an exploded perspective view of an electronic device when viewed in a first direction according to various embodiments of the present invention.
Figure 8:
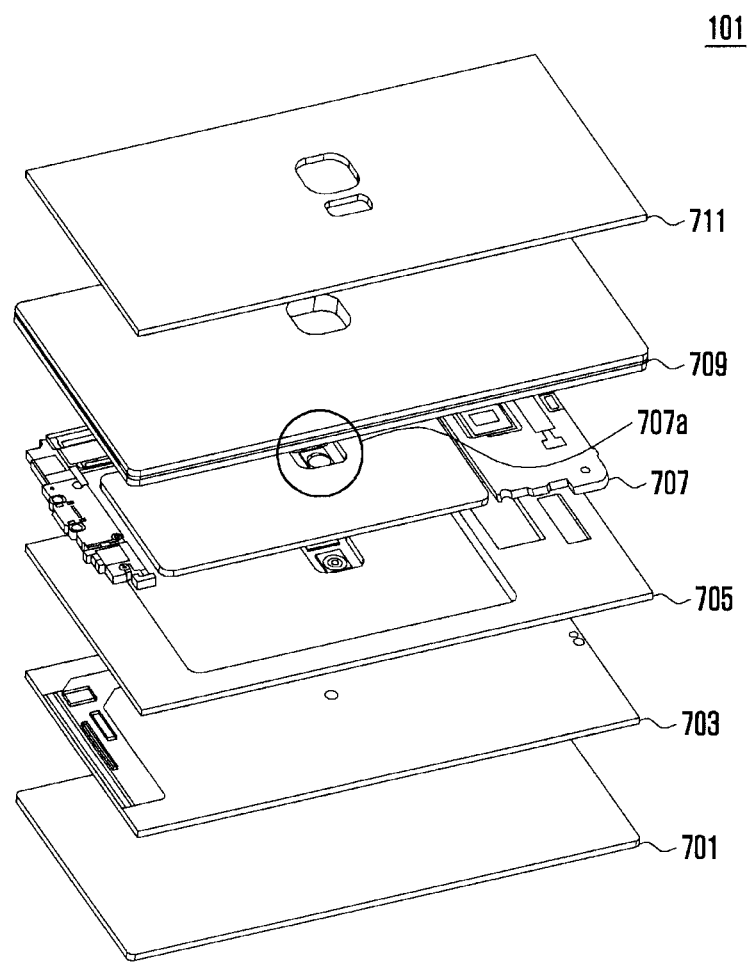
FIG. 8 is an exploded perspective view of an electronic device when viewed in a second direction according to various embodiments of the present invention.
Figure 9:
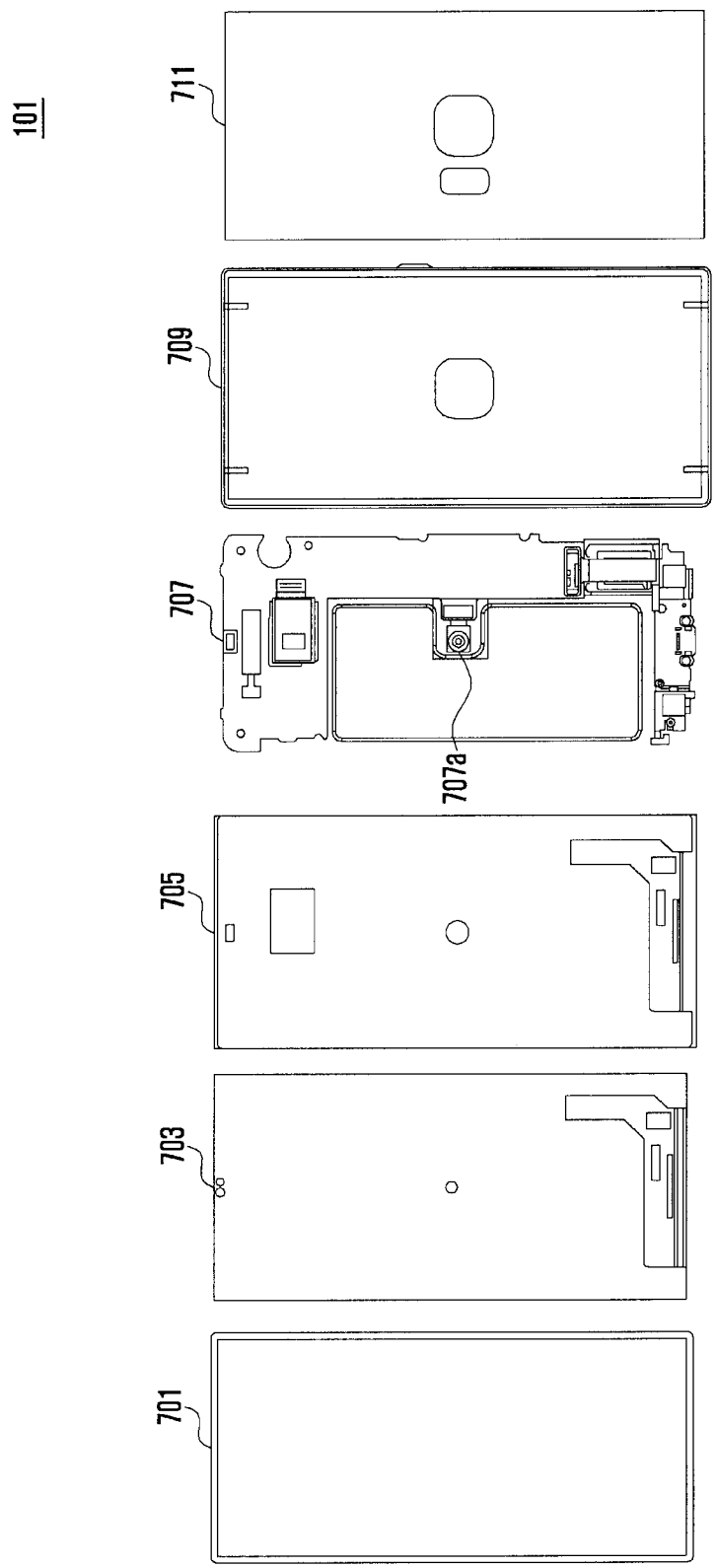
FIG. 9 is an exploded top plan view of an electronic device according to various embodiments of the present invention.

FIG. 7 is an exploded perspective view of an electronic device 101 when viewed in a first direction according to various embodiments of the present invention, FIG. 8 is an exploded perspective view of an electronic device 101 when viewed in a second direction according to various embodiments of the present invention, and FIG. 9 is an exploded top plan view of an electronic device 101 according to various embodiments of the present invention.

According to various embodiments, the electronic device 101 may include a window 701, display 703 (e.g., the display 160), bracket 705, PCB 707, rear case 709, and rear member (e.g., glass) 711.

According to various embodiments, the window 701 may be disposed in a first direction (e.g., a front direction) of the electronic device 101. The window 701 may be made of tempered glass. The window 701 may transmit light output from the display 703 (e.g., the display 160) disposed at a lower portion. The display 703 (e.g., the display 160) may be disposed at a lower portion of the window 701 and an upper portion of the bracket 705. At a lower portion of the bracket 705, the PCB 707 may be disposed. The bracket 705 may support the window 701 and the display 703 (e.g., the display 160) to be fixed in a first direction of the electronic device 101, for example, a front direction of the electronic device 101.

According to various embodiments, at the PCB 707, at least one of the processor 110, communication module 120, memory 130, sensor module 140, input device 150, and interface 170 may be disposed. The PCB 707 may be disposed at a lower portion of the bracket 705 and an upper portion of the rear case 709. The rear case 709 may configure at least a portion of the housing 200. The rear case 709 may support the PCB 707 to be fixed to the electronic device 101. At a lower portion of the rear case 709, the rear member 711 may be disposed. The rear member 711 may be made of tempered glass. The rear member 711 may protect an external form of the electronic device 101 from an external impact. As a screen of the display 703 is enlarged, a front camera 707a may exist at the center of the PCB 707, and in this case, when photographing is performed using the front camera 707a, photographing may be performed by transmitting the display 703.

Figure 10:
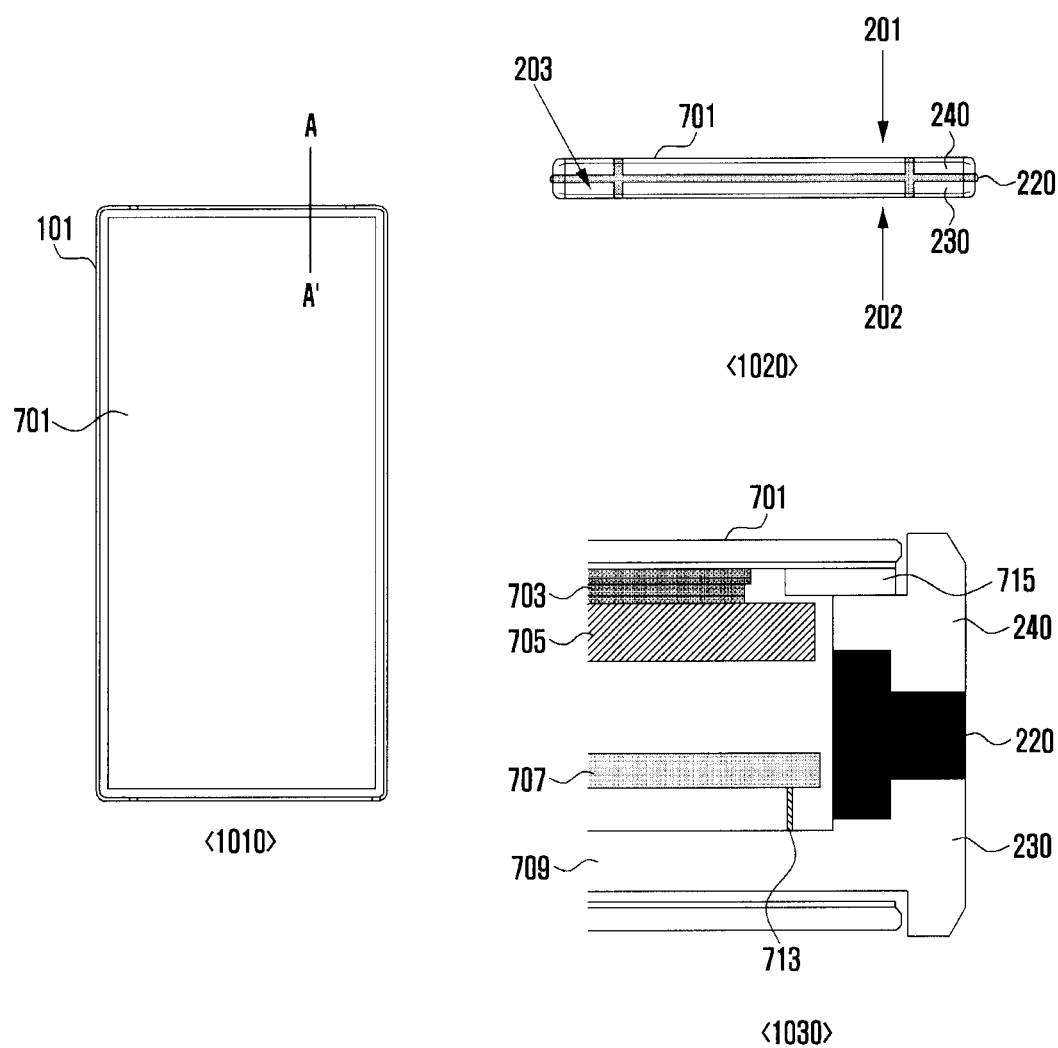
FIG. 10 is a view of an electronic device according to various embodiments of the present invention.

FIG. 10 is a view of an electronic device 101 according to various embodiments of the present invention.

Reference numeral 1010 indicates a front surface of the electronic device 101. According to various embodiments, the electronic device 101 may include a window 701 in a first direction, for example, in a front direction.

Reference numeral 1020 indicates one side surface of the electronic device 101. According to various embodiments, the electronic device 101 may include a first conductive member 230 (e.g., at least one conductive member 210) and a second conductive member 240 (e.g., at least one conductive member 210) in the side member 203. An insulating member 220 may be included between the first conductive member 230 and the second conductive member 240.

According to various embodiments, the first conductive member 230 (e.g., at least one conductive member 210) may be disposed close to the second plate 202 rather than the second conductive member 240 (e.g., at least one conductive member 210).

According to various embodiments, the second conductive member 240 (e.g., at least one conductive member 210) may be disposed close to the first plate 201 rather than the first conductive member 230 (e.g., at least one conductive member 210). The insulating member 220 may physically separate the first conductive member 230 and the second conductive member 240. By physically separating the first conductive member 230 and the second conductive member 240, the insulating member 220 may block an electrical connection between the first conductive member 230 and the second conductive member 240. The first conductive member 230 and the second conductive member 240 and at least a portion of the insulating member 220 may be disposed to come in close contact with each other in parallel to each other on the side member 203, but at least a portion of the insulating member 220 may be disposed in a cross shape to adjust a length of the first conductive member 230 or the second conductive member 240.

Reference numeral 1030 indicates a cross-section of the electronic device 101 taken in a direction A-A'.

According to various embodiments, the window 701 may be disposed in a first direction, for example, a front direction of the electronic device 101. The window 701 may be made of tempered glass. The window 701 may transmit light output from a display 703 (e.g., the display 160) disposed at a lower portion. The display 703 (e.g., the display 160) may be disposed at a lower portion of the window 701 and an upper portion of a bracket 705. At a lower portion of the bracket 705, a PCB 707 may be disposed. The bracket 705 may support the window 701 and the display 703 (e.g., the display 160) to be fixed in a first direction of the electronic device 101, for example, a front direction of the electronic device 101.

According to various embodiments, the bracket 705 may be spaced apart from the second conductive member 240. According to various embodiments, when the bracket 705 and the second conductive member 240 contact with each other, the electronic device 101 may further include an insulating member between the bracket 705 and the second conductive member 240.

According to various embodiments, there may be a structure in which the second conductive member 240 is not connected to the ground or the conductive member within the electronic device 101.

According to various embodiments, a support member 715 may support the second conductive member 240 in a direction of the window 701 and may be configured with an insulating member. The support member 715 may have various shapes; thus, it may be electrically separated from peripheral devices. According to various embodiments, the electronic device 101 may separate the second conductive member 240 and the window 701 without the support member 715. Further, the second conductive member 240 may be physically, chemically, or mechanically bonded to the insulating member 220 to be supported by the insulating member 220.

According to various embodiments, at the PCB 707, at least one of the processor 110, communication module 120, memory 130, sensor module 140, input device 150, and interface 170 may be disposed. The PCB 707 may be disposed at a lower portion of the bracket 705 and an upper portion of a rear case 709. The rear case 709 may configure at least a portion of the housing 200. The rear case 709 may support the PCB 707 to be fixed to the electronic device 101.

At a lower portion of the rear case 709, a rear member 711 may be disposed. The rear member 711 may be made of tempered glass. The rear member 711 may protect an external form of the electronic device 101 from an external impact. According to various embodiments, the PCB 707 may be electrically connected to at least one of the first conductive member 230 and the rear case 709, and the PCB 707 may be connected to at least one of the first conductive member 230 and the rear case 709 through a feeding line 713.

According to various embodiments, the second conductive member 240 (e.g., at least one conductive member 210) may be disposed adjacent to the display 703. The first conductive member 230 (e.g., at least one conductive member 210) may be disposed adjacent to the rear case 709 or the rear member 711. The first conductive member 230 may be electrically connected (e.g., feeding connection 713) to the PCB 707. The first conductive member 230 may be electrically connected to the communication module 120 disposed at the PCB 707.

According to various embodiments, the insulating member 220 may separate the first conductive member 230 and the second conductive member 240. The insulating member 220 may be bonded to the first conductive member 230 and the second conductive member 240. In order to improve bonding strength to the first conductive member 230 and the second conductive member 240, an area of the insulating member 220 may be enlarged in an inner direction of the electronic device 101. In a cross-sectional view of the electronic device 101 in a direction A-A', an area of the insulating member 220 of an inner direction of the electronic device 101 including the PCB 707 may be larger than that of the insulation member 220 of an outward direction of the electronic device 101. For example, the insulating member 220 may have an inclined T-shape in which an area of an inner direction of the electronic device 101 is larger than that of an outer direction of the electronic device 101.

Figure 11:
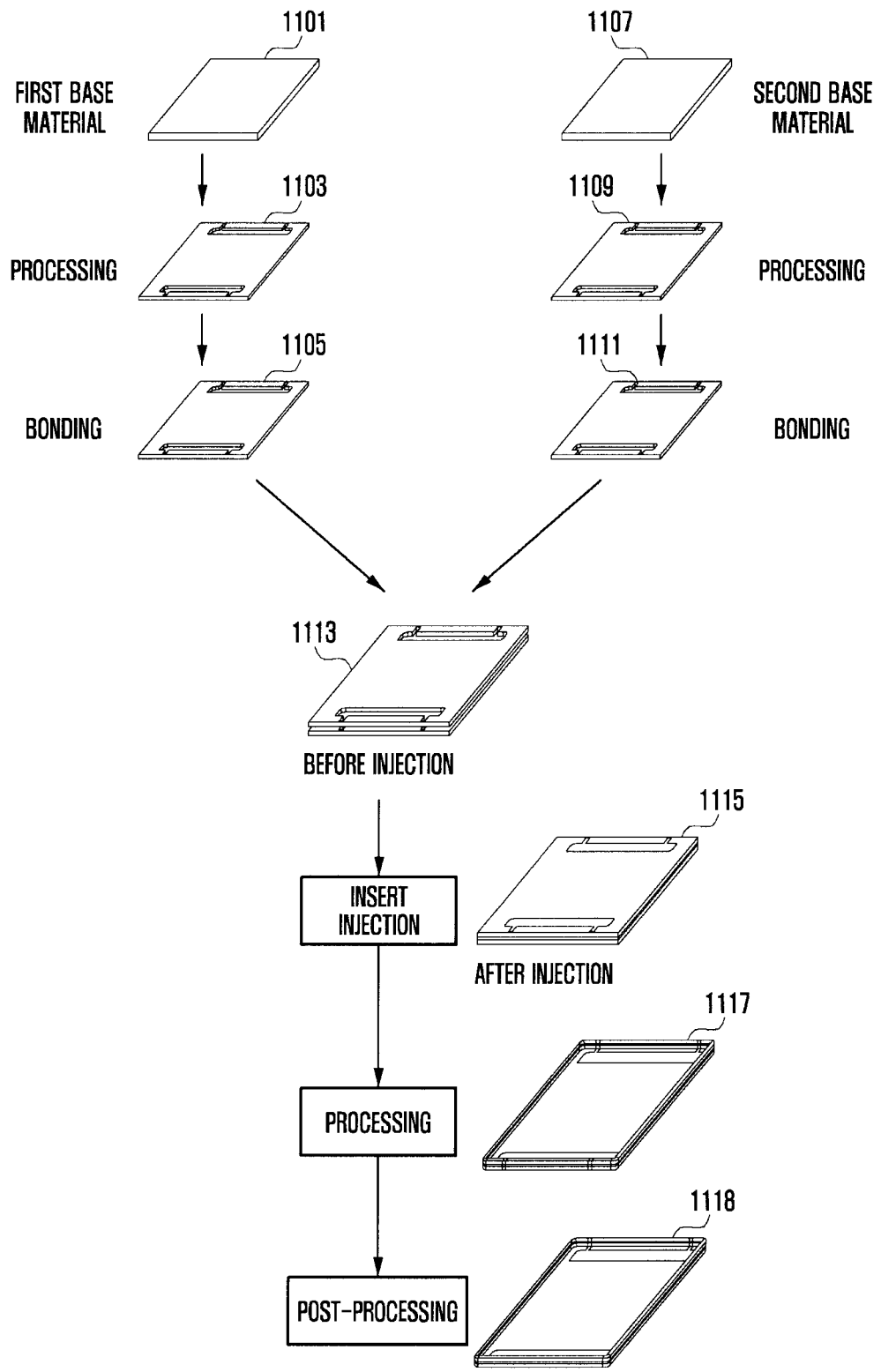
FIG. 11 illustrates a process of processing a housing of an electronic device according to various embodiments of the present invention.

FIG. 11 illustrates a process of processing a housing 200 of an electronic device 101 according to various embodiments of the present invention.

In operation 1101, a first base material may be processed according to a size of the housing 200. In operation 1103, the first base material may be processed in consideration of a component to be disposed. In operation 1107, a second base material may be processed according to a size of the housing 200. The first base material and the second base material may be a metal material. The first base material and the second base material may be a conductive member. In operation 1109, the second base material may be processed in consideration of a component to be disposed. In operations 1105 and 1111, the processed first base material and second base material may be bonded. In operation 1113, a shape of the first base material and the second base material processed before insert injection may be shown. In operation 1115, the processed first base material and second base material may be insert-injected. During insert injection, the insulating member or the insulating material may be injected between the bonded first base material and second base material. In operation 1117, the insert injected first base material and second base material may be processed in consideration of a component to be disposed. In operation 1118, the insert injected first base material and second base material may be post-processing processed. For example, when a boundary line exists in an external form, a post-processing process may be diamond-cutting for giving a metal feeling to the housing 200.

Figure 12:
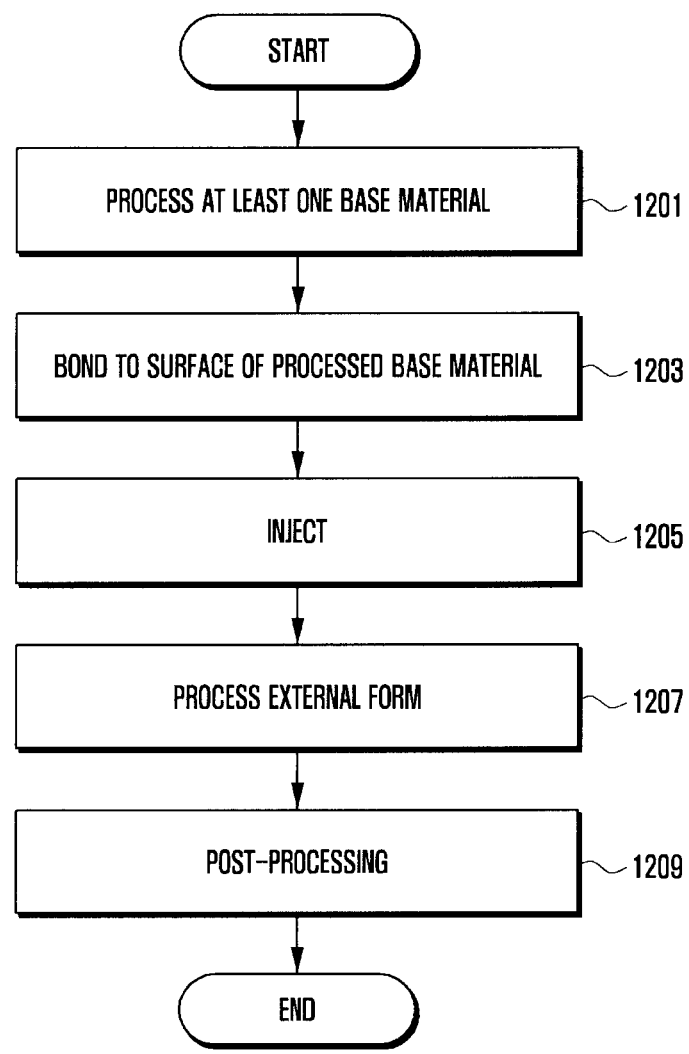
FIG. 12 is a flowchart illustrating a process of processing a housing of an electronic device according to various embodiments of the present invention.

FIG. 12 is a flowchart illustrating a process of processing a housing 200 of an electronic device 101 according to various embodiments of the present invention.

In operation 1201, at least one base material may be processed. For example, at least, one base material may be a metal material. In operation 1203, a bonding process may be performed at a surface of the processed base material. For example, for well bonding of the processed base material, a bonding processing may be a chemical processing at a surface of the processed base material. In operation 1205, an insulating material may be injected or bonded to the bonded base material. For example, a method of attaching a member (e.g., an insulating member) to the bonded base material may be an insert injection method. For example, a method of attaching a member (e.g., an insulating member) to the bonded base material may be bonding or a separate assembling method. For example, when injecting the bonded base material, the insulating member may be injected between the base material. In operation 1207, the injected base material may be processed. For example, a processing operation of the injected base material may be a step of processing in consideration of a component to be disposed. In operation 1209, a base material having a processed external form may be post-processed. For example, when a boundary line exists in an external form, a post-processing process may be diamond-cutting for giving a metal feeling to the housing 200.

Figure 13:
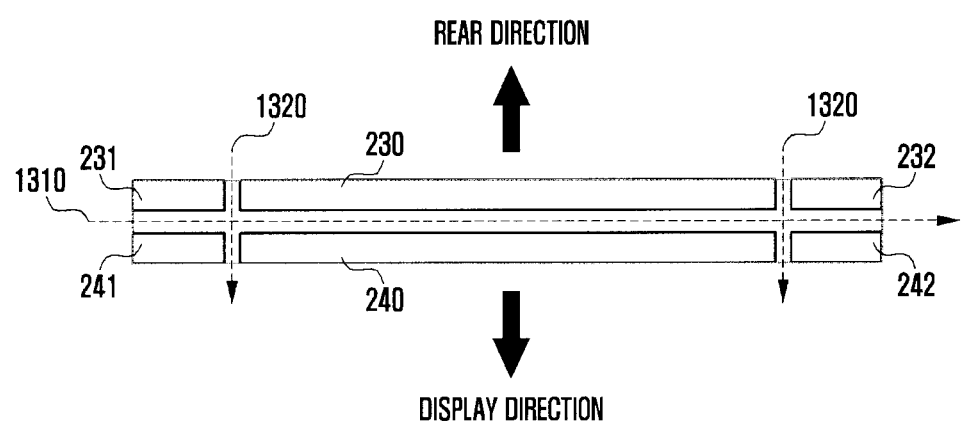
FIG. 13 is a diagram illustrating an antenna device according to various embodiments of the present invention.

FIG. 13 is a diagram illustrating an antenna device according to various embodiments of the present invention.

According to various embodiments, an electronic device 101 may include at least one of first conductive members 230, 231, and 232 and at least one of second conductive members 240, 241, and 242 in a side member 203. An insulating member 220 may be included between at least one of first conductive members 230, 231, and 232 and at least one of second conductive members 240, 241, and 242.

According to various embodiments, the at least one of first conductive members 230, 231, and 232 may be disposed close to a rear direction (e.g., the second plate 202) rather than at least one of second conductive members 240, 241, and 242.

According to various embodiments, at least one of second conductive members 240, 241, and 242 may be disposed close to a display direction (e.g., the first plate 201) rather than the at least one of first conductive members 230, 231, and 232. The insulating member 220 may physically separate at least one of first conductive members 230, 231, and 232 and at least one of second conductive members 240, 241, and 242. By physically separating at least one of first conductive members 230, 231, and 232 and at least one of second conductive members 240, 241, and 242, the insulating member 220 may block an electrical connection between the at least one of first conductive members 230, 231, and 232 and the at least one of second conductive members 240, 241, and 242. The at least one of first conductive members 230, 231, and 232 and the at least one of second conductive members 240, 241, and 242 and at least a portion of the insulating member 220 are disposed to come in close contact with each other in parallel to each other on the side member 203, but at least a portion of the insulating member 220 may be disposed in a cross shape. A disposition direction of a cross shape of at least a portion of the insulating member 220 may be a cross direction of a direction 1310 (e.g., a horizontal direction on one side surface of the electronic device 101) and a direction 1320 (e.g., a longitudinal direction on one side surface of the electronic device 101), and a cross shape may be a double cross shape.

According to various embodiments, each of at least one of first conductive members 230, 231, and 232 and at least one of second conductive members 240, 241, and 242 may be divided into many elements by an insulating member 220 whose at least one is disposed in a cross shape. For example, at least one of first conductive members 230, 231, and 232 may be a first resonance element 230, second resonant element 231, and third resonant element 232, respectively. For example, at least one of second conductive members 240, 241, and 242 may be a first dummy metal 240, second dummy metal 241, and third dummy metal 242, respectively.

FIGS. 14A to 14D are diagrams illustrating a process of processing a housing of an electronic device 101 according to various embodiments of the present invention.

Figure 14A:
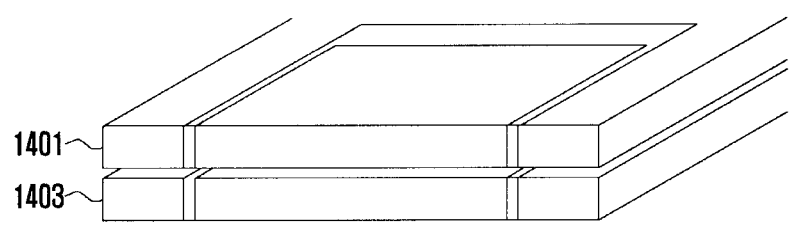
FIGS. 14A to 14D are diagrams illustrating a process of processing a housing of an electronic device according to various embodiments of the present invention.

As shown in FIG. 14A, a first base material 1401 and a second base material 1403 may be processed and/or bonded to be processed and/or bonded to secure a space in which an insulating member is to be injected by insert injection.

Figure 14B:
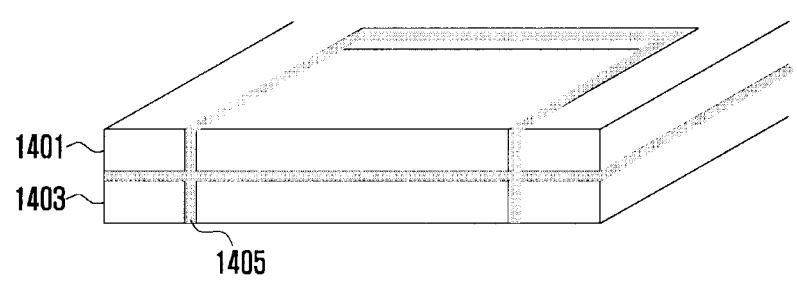

As shown in FIG. 14B, the processed and/or bonded first base material 1401 and second base material 1403 are/is injected; thus, the injection member 1405 is injected at a space between the first base material 1401 and the second base material 1403, and the first base material 1401 and the second base material 1403 may be bonded through the injection member 1405.

Figure 14C:
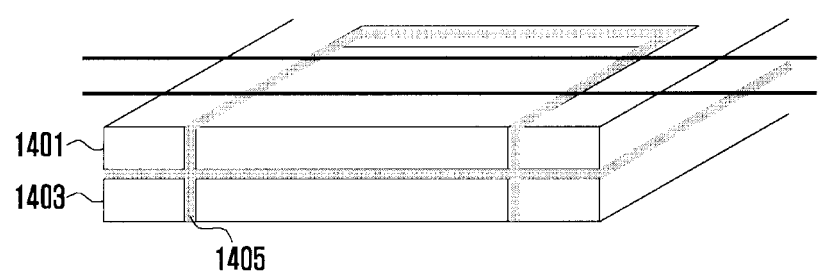

As shown in FIG. 14C, the injected first base material 1401 and second base material 1403 and the injection member 1405 may be processed. For example, a processing operation of the injected first base material 1401 and second base material 1403 and the injection member 1405 may be a processing operation in consideration of a component to be disposed.

Figure 14D:
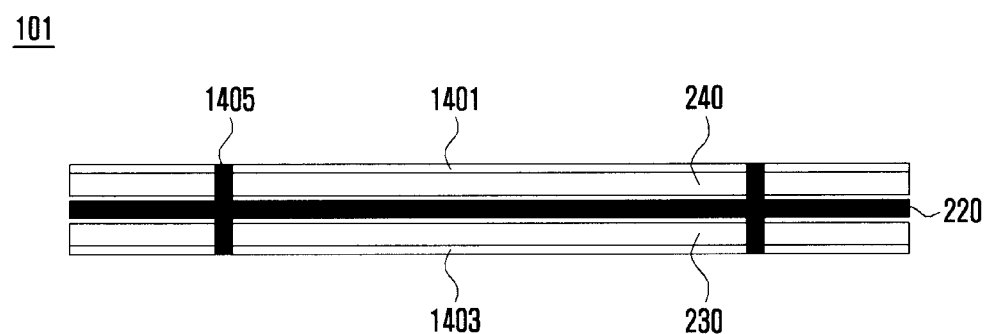

As shown in FIG. 14D, the injected first base material 1401 and second base material 1403 and the insulating member 1405 may be post-processed. For example, when a boundary line exists in an external form, a post-processing process may be diamond-cutting for giving a metal feeling to the housing 200. In this case, in the second base material 1403 of a rear direction, the first conductive member 230 may be disposed; and in the first base material 1401 of a display direction, the second conductive member 240 may be disposed. The injection member 1405 may be an insulating member 220.

Figure 15:
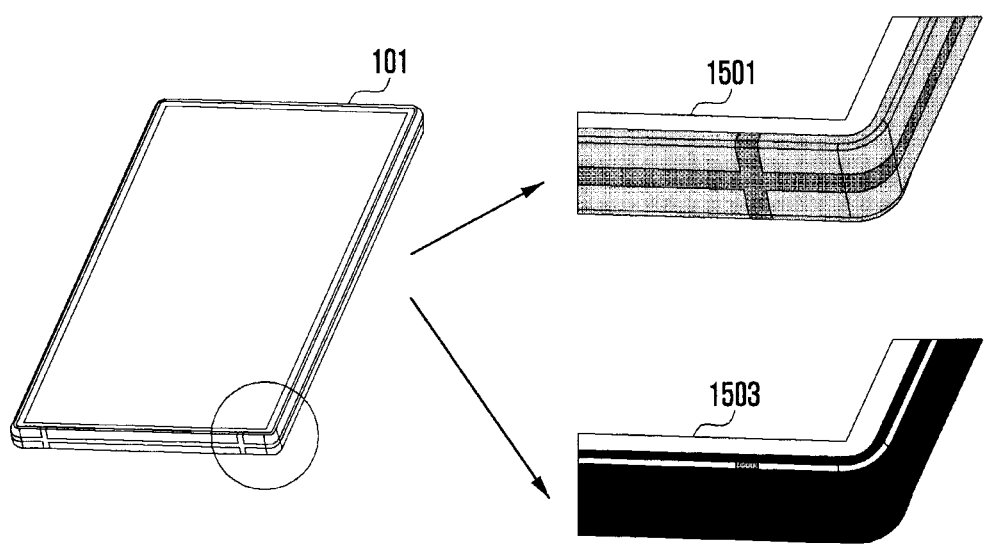
FIG. 15 is a diagram illustrating a post-processing process of an electronic device according to various embodiments of the present invention.

FIG. 15 is a diagram illustrating a post-processing process of an electronic device 101 according to various embodiments of the present invention.

At reference numeral 1501, an injected insulating member may be made of a transparent or semi-transparent material and may be post-processed to be distinguished from a metal member (e.g., a base material).

At reference numeral 1503, an injected insulating member may be post-processed to have a uniform sense with a metal member (e.g., a base material).

FIGS. 16A to 16D are views of a bonding portion at a periphery of an antenna device of an electronic device 101 according to various embodiments of the present invention.

Figure 16A:
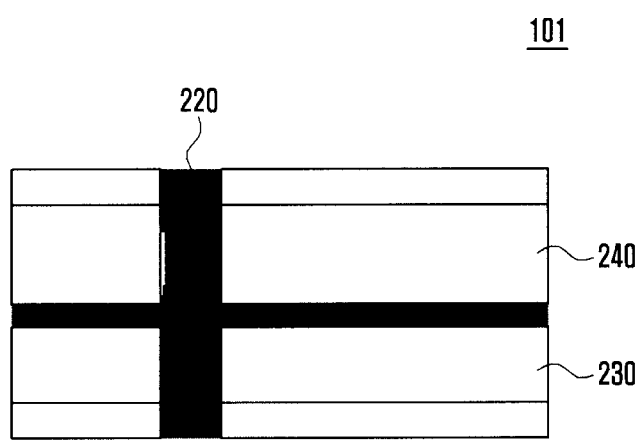
FIGS. 16A to 16D are views illustrating a bonding portion at a periphery of an antenna device of an electronic device according to various embodiments of the present invention.

In FIG. 16A, the electronic device 101 may include a first conductive member 230, second conductive member 240, and insulating member 220. The first conductive member 230 may be an antenna device. The second conductive member 240 may be a dummy metal. The insulating member 220 may be bonded to the first conductive member 230 and the second conductive member 240 and separate the first conductive member 230 and the second conductive member 240.

Figure 16B:
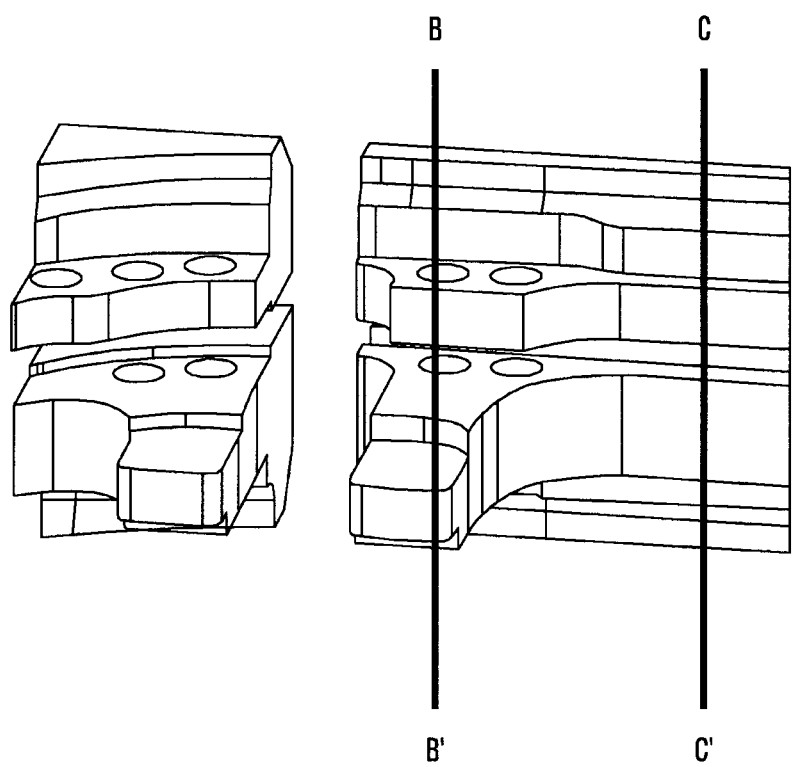
Figure 16C:
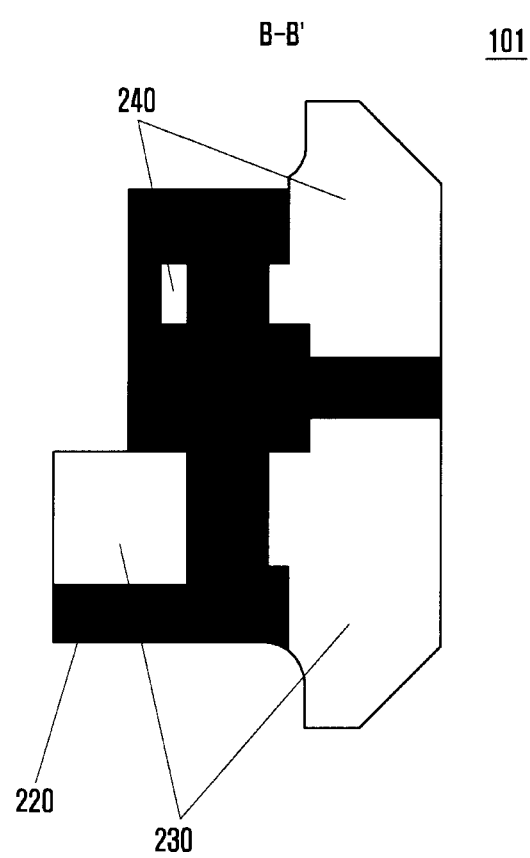
Figure 16D:
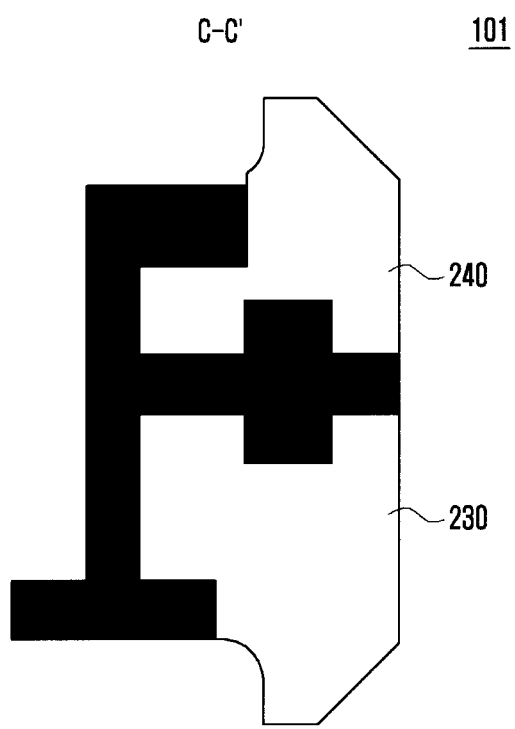

As shown in FIGS. 16B to 16D, when the electronic device 101 is cut in a direction B-B', a hole may be formed at the inside of the first conductive member 230 and the second conductive member 240; and, by injecting the insulating member 220 between the first conductive member 230 and the second conductive member 240, a bonding area may be enlarged. When the electronic device 101 is cut in a direction C-C', a groove may be formed at the bottom of the first conductive member 230 and the second conductive member 240; and, by injecting the insulating member 220 between the first conductive member 230 and the second conductive member 240, a bonding area may be enlarged.

Figure 17A:
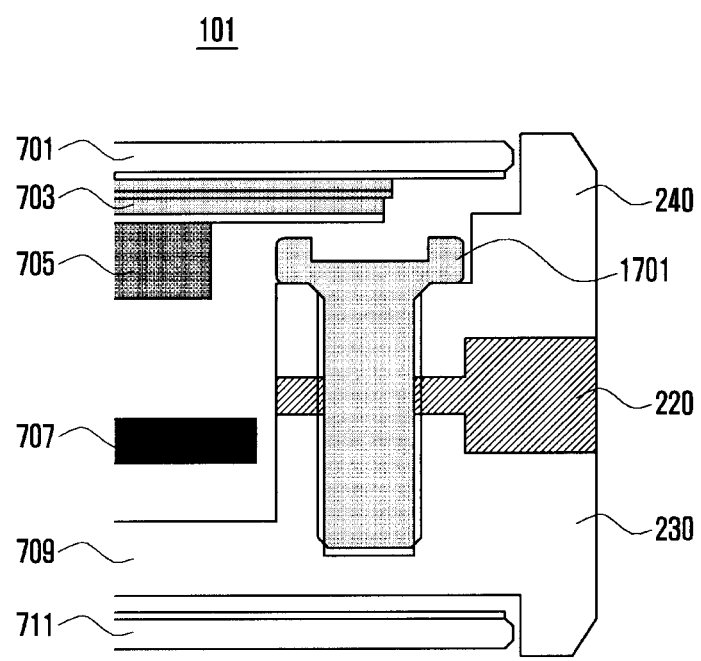
FIGS. 17A and 17B are views illustrating a bonding portion excluding an antenna device of an electronic device according to various embodiments of the present invention.
Figure 17B:
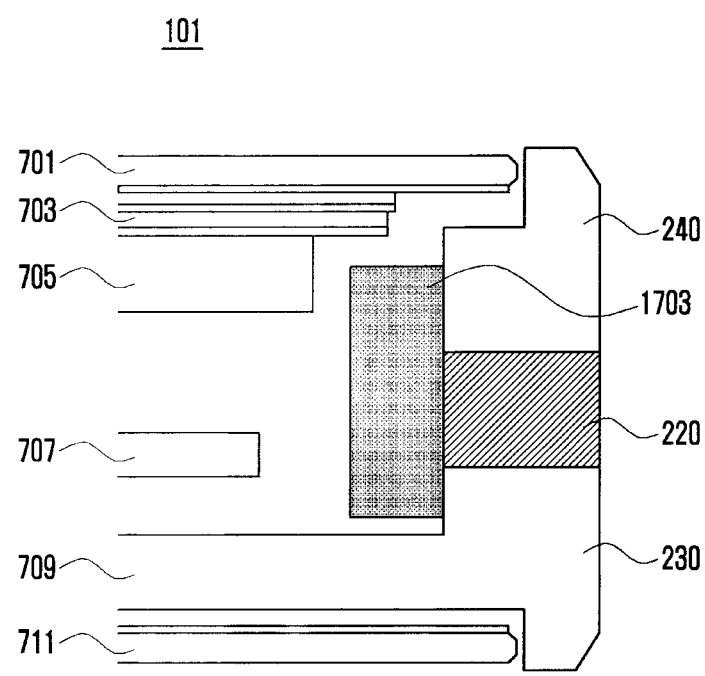

FIGS. 17A and 17B are views illustrating a bonding portion excluding an antenna device of an electronic device 101 according to various embodiments of the present invention.

According to various embodiments, a window 701 may disposed in a first direction, for example, a front direction of the electronic device 101. The window 701 may be made of tempered glass. The window 701 may transmit light output from a display 703 (e.g., the display 160) disposed at a low portion. The display 703 (e.g., the display 160) may be disposed at a lower portion of the window 701 and an upper portion of a bracket 705. At a low portion of the bracket 705, a PCB 707 may be disposed. The bracket 705 may support the window 701 and the display 703 (e.g., the display 160) to be fixed in a first direction of the electronic device 101, for example, in a front direction of the electronic device 101.

According to various embodiments, in the PCB 707, at least one of the processor 110, communication module 120, memory 130, sensor module 140, input device 150, and interface 170 may be disposed. The PCB 707 may be disposed at a lower portion of the bracket 705 and an upper portion of a rear case 709. The rear case 709 may configure at least a portion of the housing 200. The rear case 709 may support the PCB 707 to be fixed to the electronic device 101. At a lower portion of the rear case 709, a rear member 711 may be disposed. The rear member 711 may be made of tempered glass. The rear member 711 may protect an external form of the electronic device 101 from an external impact.

As shown in FIG. 17A, in order to increase bonding strength of the first conductive member 230 and the second conductive member 240, a screw 1701 may penetrate to the first conductive member 230, the second conductive member 240, and the insulating member 220 in an inward direction (e.g., an inner direction of the electronic device 101). A structure of FIG. 17A having a coupling structure by the screw 1701 may be easily applied to the left/right side rather than the upper end/the lower end in which a metal antenna (e.g., the first conductive member 230) is mounted; and, in a portion having a coupling structure by the screw 1701, the second conductive member 240 may not be used as an antenna.

As shown in FIG. 17B, in order to increase bonding strength of the first conductive member 230 and the second conductive member 240, the first conductive member 230, the second conductive member 240, and the insulating member 220 of an inward direction (e.g., an inner direction of the electronic device 101) may be welded by a separate metal 1703. A structure of FIG. 17B having a structure that is welded with the separate metal 1703 may be easily applied to the left/right side rather than the upper end/lower end in which a metal antenna (e.g., the first conductive member 230) is mounted; and, in a portion having a structure that is welded with the separate metal 1703, the second conductive member 240 may not be used as the antenna.

Figure 18:
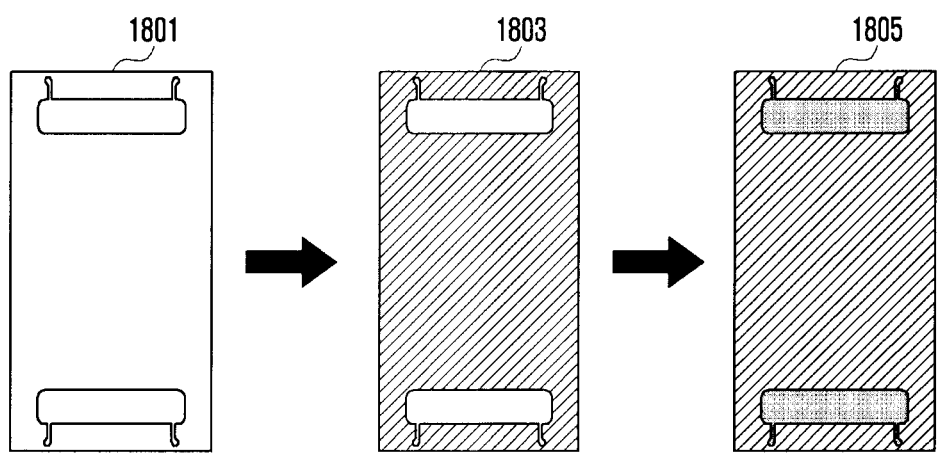
FIG. 18 is a diagram illustrating a process of processing a housing of an electronic device according to various embodiments of the present invention.

FIG. 18 is a diagram illustrating a process of processing a housing 200 of an electronic device 101 according to various embodiments of the present invention.

In operation 1801, a base material may be processed. In operation 1803, the processed base material may be bonded to a base material surface. In operation 1805, a member (e.g., an insulating member) may be injected, bonded, and coupled to the bonded base material.

Figure 19A:
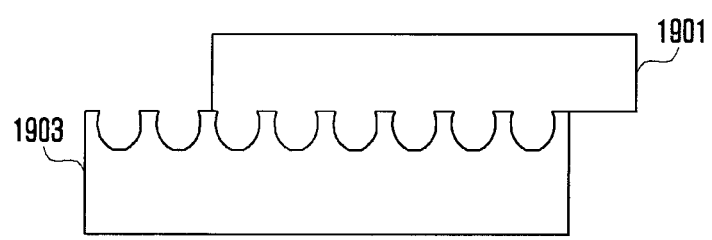
FIGS. 19A and 19B are diagrams illustrating a method of bonding a base material and an insulator of an electronic device according to various embodiments of the present invention.
Figure 19B:
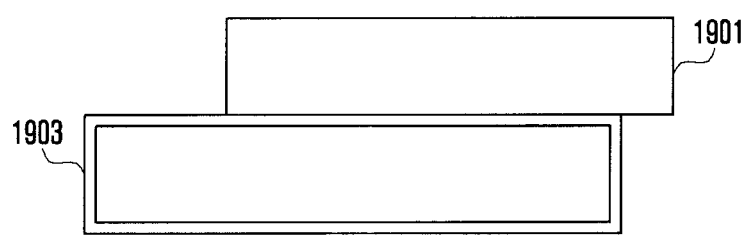

FIGS. 19A and 19B are diagrams illustrating a method of bonding a base material and an insulator of an electronic device 101 according to various embodiments of the present invention.

As shown in FIG. 19A, by roughly processing a surface of a base material 1903, bonding strength of a resin (e.g., an injection member 1901) can be increased.

As shown in FIG. 19B, by performing a pre-processing at a surface of the base material 1903, bonding strength of a resin (e. g., an injection member 1901) can be increased.

Figure 20:
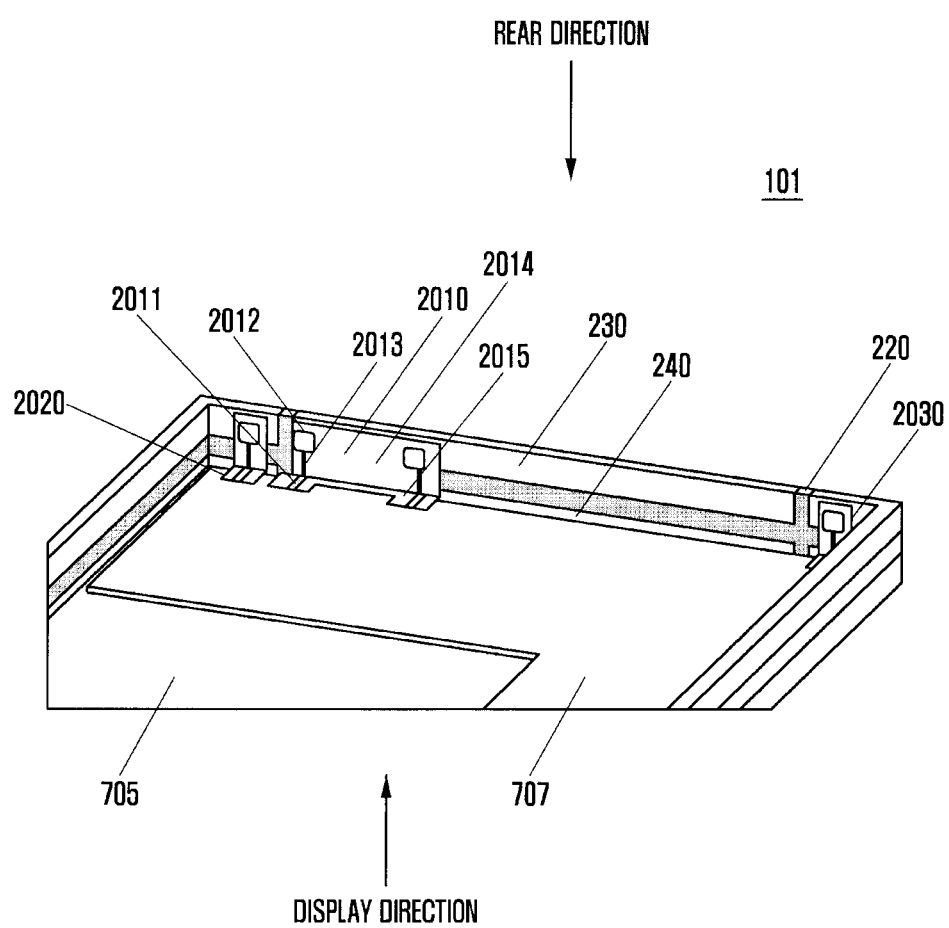
FIG. 20 is a perspective view illustrating an antenna device according to various embodiments of the present invention.

FIG. 20 is a perspective view illustrating an antenna device 230 according to various embodiments of the present invention.

According to various embodiments, the electronic device 101 may include at least one fill-cut area. According to various embodiments, the electronic device 101 may include a first fill-cut area 2010, second fill-cut area 2020, or third fill-cut area 2030. In each of the fill-cut areas, at least a partial area of a PCB 707 may be a partial area of the PCB 707 protruded in a direction of the antenna device 230 in order to feed power to the electronic device 101. The antenna device 230 may be the same as the first conductive member 230. The PCB 707 may be supported by a bracket 705.

According to various embodiments, the first fill-cut area 2010, the second fill-cut area 2020, and the third fill-cut area 2030 each may have the same configuration. For example, the first fill-cut area 2010 may include a matching circuit 2011, contact portion 2012, signal line 2013, and element portion 2014. When the antenna device 230 and the PCB 707 are connected to each other, the matching circuit 2011 may be a circuit for impedance matching. The contact portion 2012 electrically connects the first fill-cut area 2010 and the antenna device 230 and may be, for example, a screw. The signal line 2013 may electrically connect the matching circuit 2011 and the contact portion 2012. The element portion 2014 may include at least one of a device that may be grounded according to a resonance property, electric shock prevention material (e.g., varistor), capacitor, and inductance.

Figure 21:
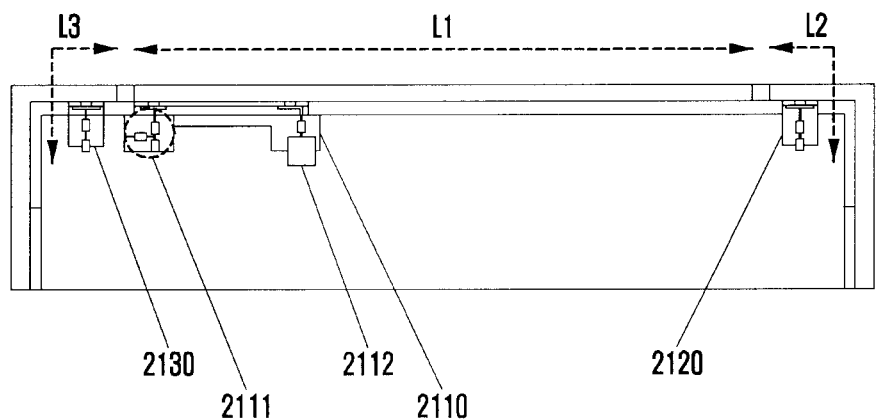
FIG. 21 is a diagram illustrating an antenna device according to various embodiments of the present invention.

FIG. 21 is a diagram illustrating an antenna device 230 according to various embodiments of the present invention.

In various embodiments, the antenna device 230 may include a first resonant element 230, second resonance element 231, and third resonant element 232. The first resonance element 230 may be the same as the antenna device 230, or the first conductive member 230.

In various embodiments, the electronic device 101 may include a first fill-cut area 2110, second fill-cut area 2120, and third fill-cut area 2130. The first fill-cut area 2110 may include a tuner circuit 2110 and a matching circuit 2111. The first fill-cut area 2110 may be electrically connected to the first resonant element 230. The second fill-cut area 2120 may be electrically connected to the second resonant element 231. The third fill-cut area 2130 may be electrically connected to the third resonant element 232. A low band resonant frequency may be determined by a length L1 of the first resonant element 230, a high band resonance frequency may be determined by a length L2 of the second resonant element 231, and a middle band resonance frequency may be determined by a length L3 of the third resonant element 232. The electronic device 101 may control the tuner circuit 2110 included in the first fill-cut area 2110, for example, according to a command (e.g., control) of the processor 110 to change a low band (LB) resonance frequency.

Figure 22:
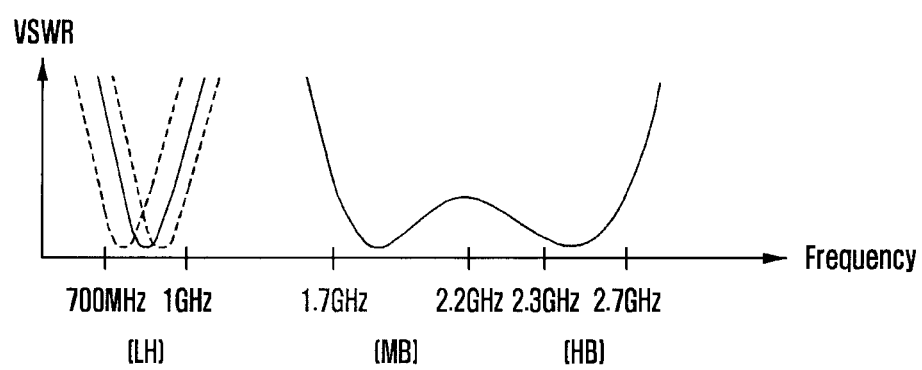
FIG. 22 is a graph illustrating a frequency band of the antenna device of FIG. 21.

FIG. 22 is a graph illustrating a frequency band of the antenna device 230 of FIG. 21.

According to various embodiments, the electronic device 101 may control the tuner circuit 2110 included in the first fill-cut area 2110, for example, according to a command (e.g., control) of the processor 110 to change a low band (LB) resonance frequency.

Figure 23:
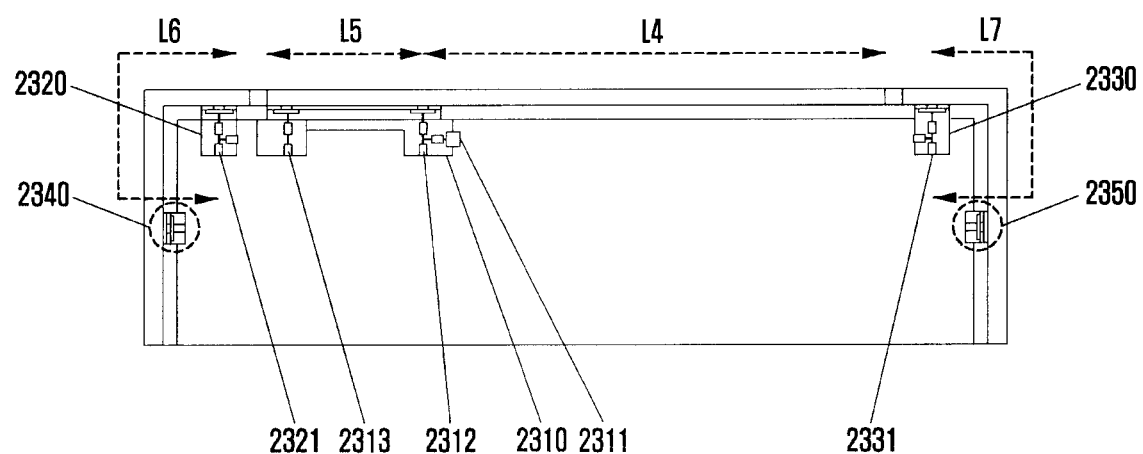
FIG. 23 is a diagram illustrating an antenna device according to various embodiments of the present invention.

FIG. 23 is a diagram illustrating an antenna device 230 according to various embodiments of the present invention.

In various embodiments, the antenna device 230 may include a first resonant element 230, second resonance element 231, and third resonant element 232. The first resonance element 230 may be the same as the antenna device 230 or the first conductive member 230.

In various embodiments, the electronic device 101 may include a first fill-cut area 2310, second fill-cut area 2320, third fill-cut area 2330, and ground area 2340. The first fill-cut area 2310 may include a tuner circuit 2311, first feed portion 2312, and first ground portion 2313. The first fill-cut area 2310 may be electrically connected to the first resonant element 230. The second fill-cut area 2320 may be electrically connected to the second resonant element 231. The third fill-cut area 2330 may be electrically connected to the third resonant element 232. A low band resonance frequency may be determined by a first length L4 and a second length L5 of the first resonant element 230, a high band resonance frequency may be determined by a third length L6 of the second resonance element 231, and a middle band resonance frequency may be determined by a four length L7 of the third resonant element 232. The electronic device 101 may control the tuner circuit 2311 included in the first fill-cut area 2310, for example, according to a command (e.g., control) of the processor 110 to change a low band (LB) resonance frequency.

Figure 24:
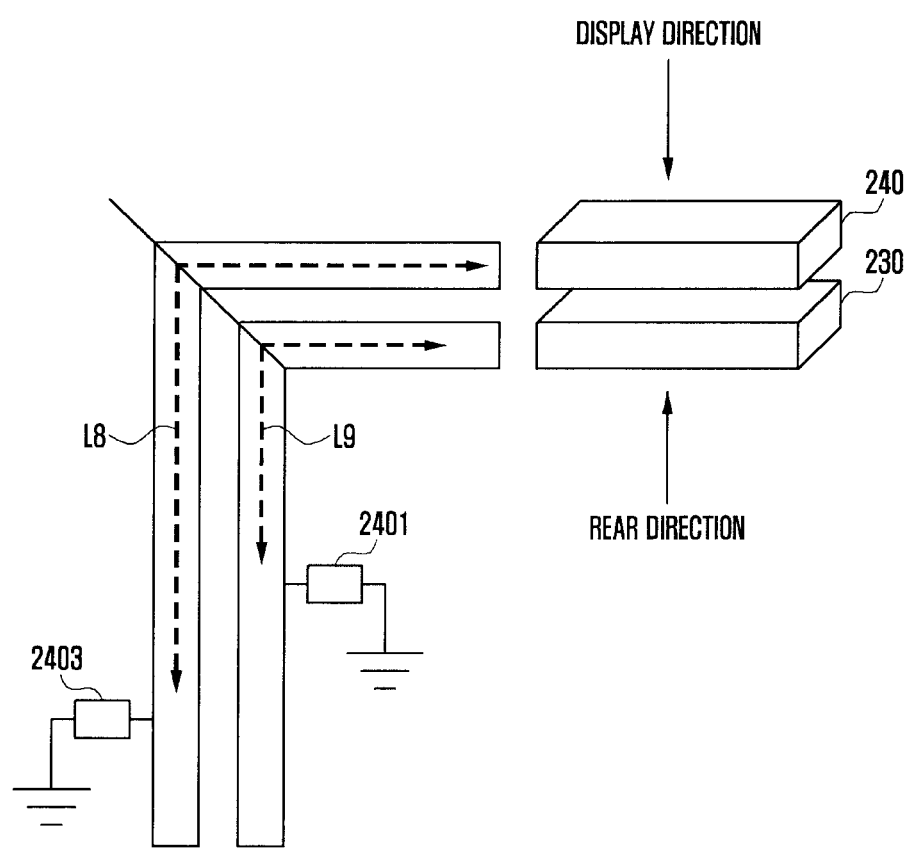
FIG. 24 is a diagram illustrating an antenna device according to various embodiments of the present invention.

FIG. 24 is a diagram illustrating an antenna device 230 according to various embodiments of the present invention.

In various embodiments, the antenna device 230 may electrically connect dummy metals (e.g., 241, 242) divided at a corner area of a second conductive member 240 to a passive element 2403 to control an antenna performance. The antenna device 230 may electrically connect conductive members 230 (e.g., 231, 232) divided at a corner area of the first conductive member 230 to a passive element 2401 to control an antenna performance.

Figure 25:
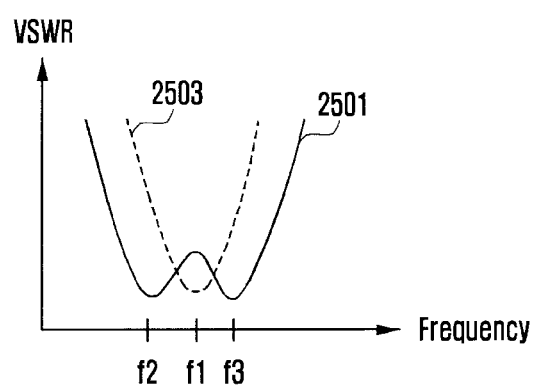
FIG. 25 is a graph illustrating a frequency band of the antenna device of FIG. 24.

FIG. 25 is a graph illustrating a frequency band of the antenna device 230 of FIG. 24.

In various embodiments, when a length L8 of dummy metals (e.g., 241, 242) divided in a corner area of the second conductive member 240 is the same as a length L9 of the conductive members (e.g., 231, 232) divided at a corner area of the first conductive member 230, resonant frequencies may correspond, as shown in a graph 2501. When a length L8 of dummy metals (e.g., 241, 242) divided in a corner area of the second conductive member 240 is different from a length L9 of the conductive members (e.g., 231, 232) divided at a corner area of the first conductive member 230, resonant frequencies may be different, as shown in a graph 2503.

Figure 26A:
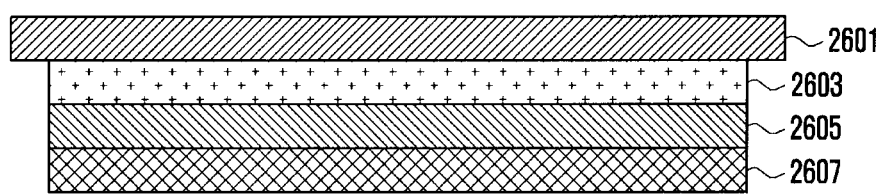
FIGS. 26A to 26E are cross-sectional views illustrating a display according to various embodiments of the present invention.
Figure 26B:
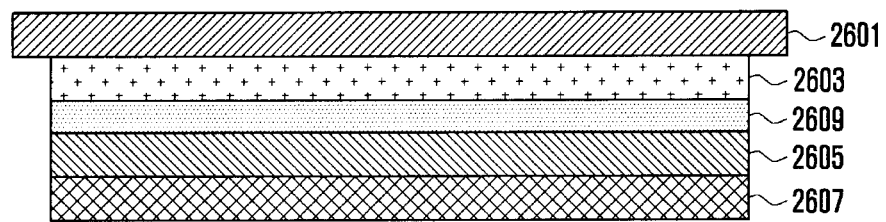
Figure 26C:
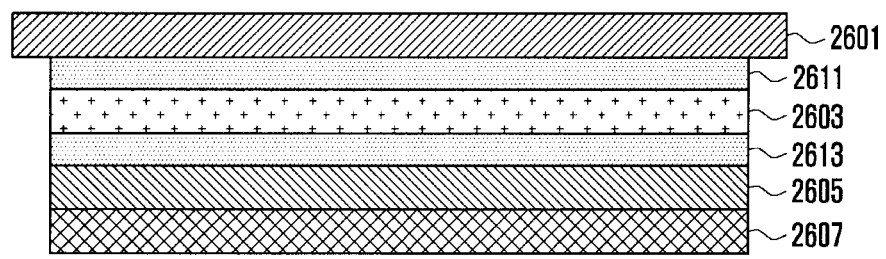
Figure 26D:
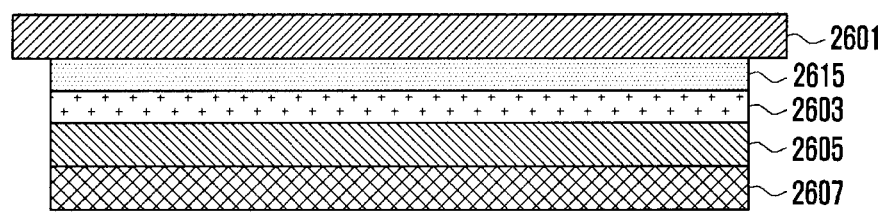
Figure 26E:
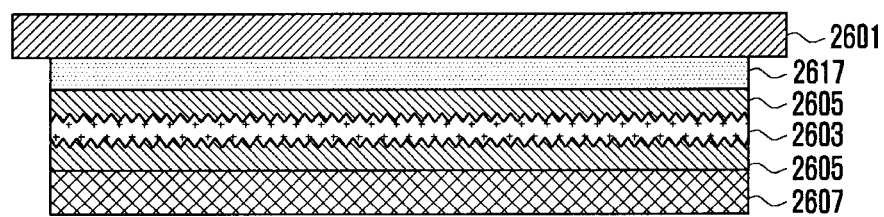

FIGS. 26A to 26E are cross-sectional views of a display 703 according to various embodiments of the present invention. In FIG. 26A, in the display 703, cover glass 2601, a touch sensor panel 2603, a display 2605, and a pressure sensor 2607 may be stacked in this order from an upper layer. In FIG. 26B, in the display 703, cover glass 2601, a touch sensor panel 2603, an adhesive layer 2609, a display 2605, and a pressure sensor 2607 may be stacked in this order from an upper layer. The adhesive layer 2609 may be disposed between the touch sensor panel 2603 and the display 2605. In FIG. 26C, in the display 703, cover glass 2601, a first adhesive layer 2611, a touch sensor panel 2603, a second adhesive layer 2613, a display 2605, and a pressure sensor 2607 may be stacked in this order from an upper layer. The first adhesive layer 2611 may be disposed between the cover glass 2601 and the touch sensor panel 2603. The second adhesive layer 2613 may be disposed between the touch sensor panel 2603 and the display 2605. In FIG. 26D, in the display 703, cover glass 2601, an adhesive layer 2615, a touch sensor panel 2603, a display 2605, and a pressure sensor 2607 may be stacked in this order from an upper layer. The adhesive layer 2615 may be disposed between the touch sensor panel 2603 and the cover glass 2601. In FIG. 26E, in the display 703, cover glass 2601, an adhesive layer 2617, a display 2605, a touch sensor panel 2603, a display 2605, and a pressure sensor 2607 may be stacked in this order from an upper layer. The adhesive layer 2617 may be disposed between the touch sensor panel 2603 and the cover glass 2601. The display 2605 may include a touch sensor panel 2603 therebetween. The touch sensor panel 2603 may be disposed at an intermediate portion of the display 2605.

FIGS. 27A to 27F are cross-sectional views of a display 703 according to various embodiments of the present invention.

Figure 27A:
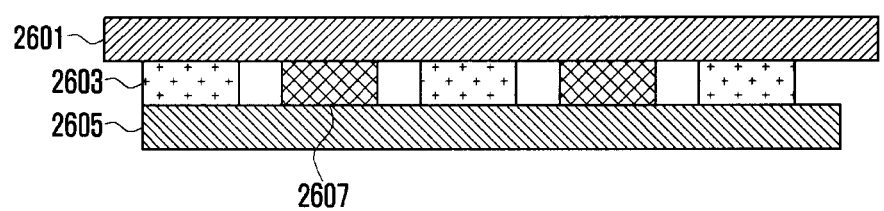
FIGS. 27A to 27F are cross-sectional views illustrating a display according to various embodiments of the present invention.

In FIG. 27A, in the display 703, at least one of the cover glass 2601, the touch sensor panel 2603, and the pressure sensor 2607 may be disposed from an upper layer, and the cover glass 2601, the touch sensor panel 2603 or the pressure sensor 2607, and the display 2605 may be stacked in this order. In FIG. 27A, at least one of the touch sensor panel 2603 and the pressure sensor 2607 may be disposed to intersect between the cover glass 2601 and the display 2605.

Figure 27B:
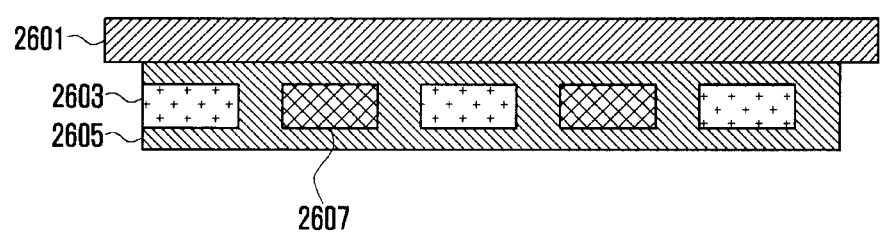

In FIG. 27B, in the display 703, the cover glass 2601 and the display 2605 may be stacked in this order from an upper layer. In FIG. 27B, at least one of the touch sensor panel 2603 and the pressure sensor 2607 may be disposed to intersect between the display 2605.

Figure 27C:
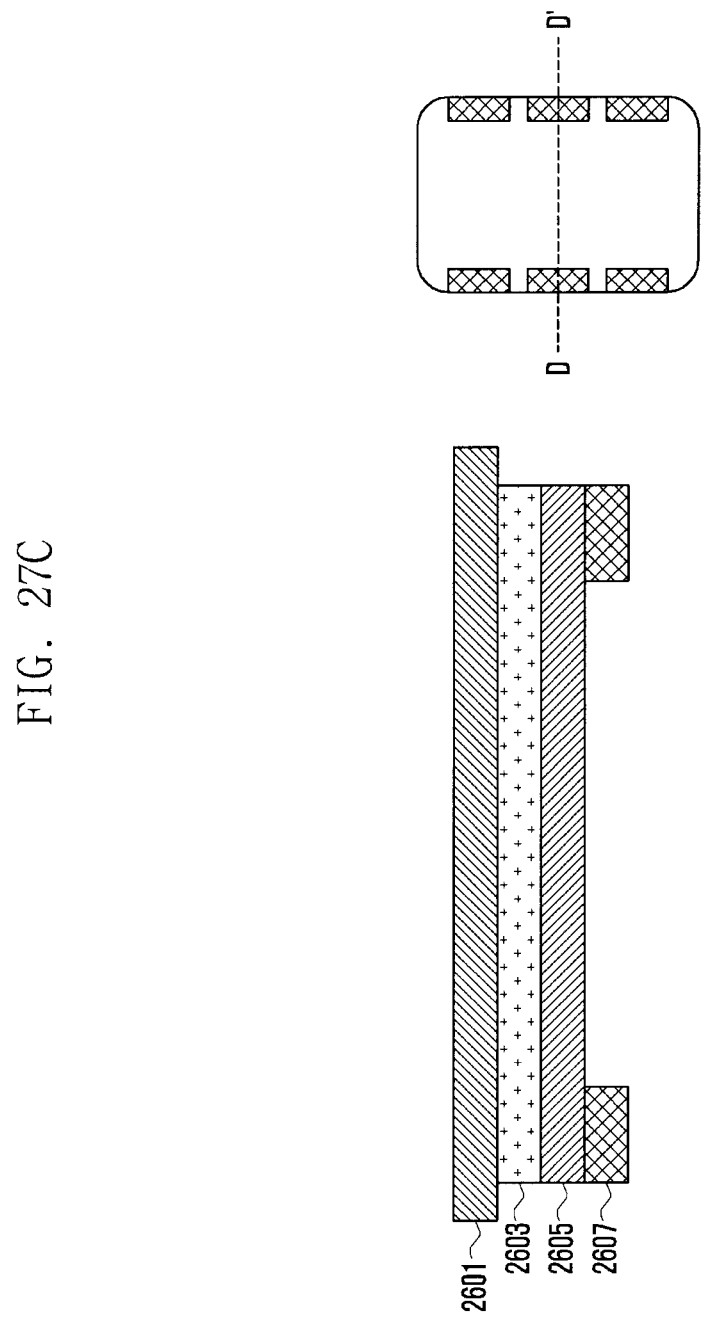

FIG. 27C is a cross-sectional view taken in a direction D-D' when viewed from a front surface of the display 703.

In FIG. 27C, in the display 703, the cover glass 2601, the touch sensor panel 2603, the display 2605, and the pressure sensor 2607 may be stacked in this order from an upper layer. In FIG. 27C, the pressure sensor 2607 may be disposed only in a partial area of the display 703.

Figure 27D:
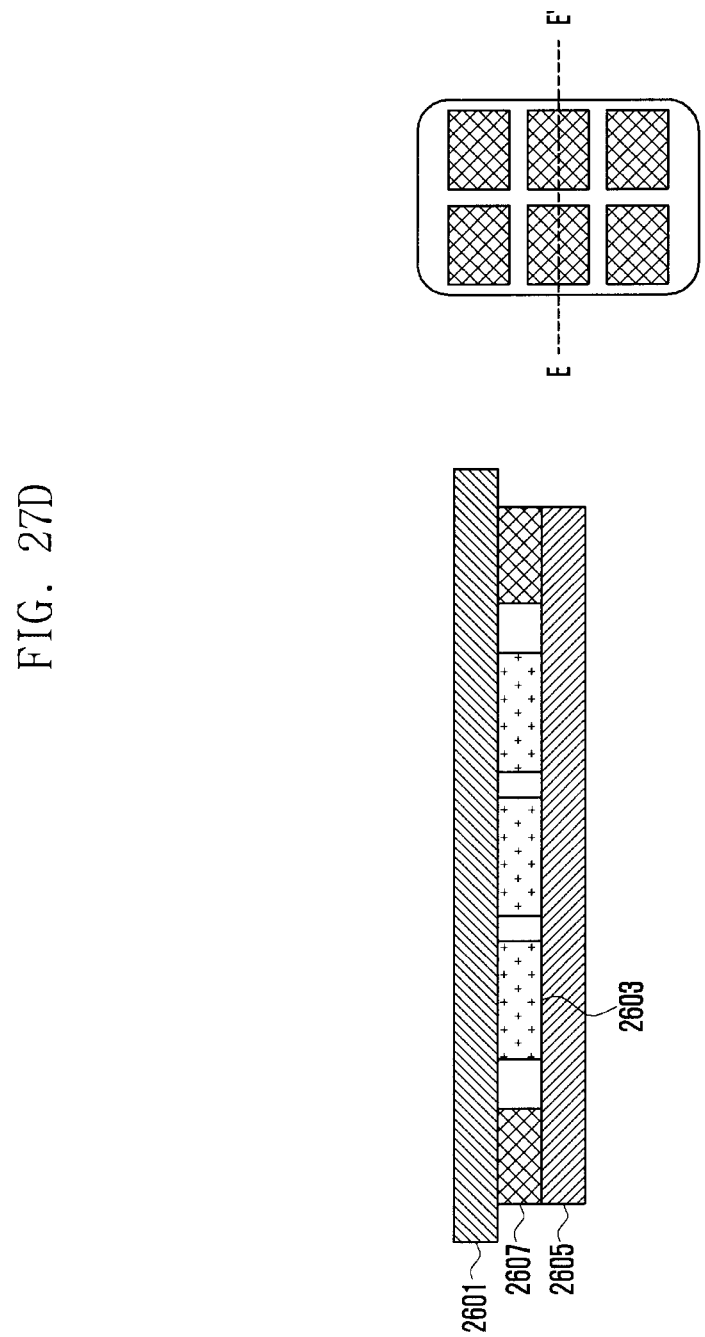

FIG. 27D is a cross-sectional view taken in a direction E-E' when viewed from a front surface of the display 703.

In FIG. 27D, in the display 703, at least one of the cover glass 2601, the touch sensor panel 2603, and the pressure sensor 2607 may be disposed from an upper layer, and the cover glass 2601, the touch sensor panel 2603 or the pressure sensor 2607, and the display 2605 may be stacked in this order. In FIG. 27D, at least one touch sensor panel 2603 or the pressure sensor 2607 may be disposed at a partial area of the display 703 between the cover glass 2601 and the display 2605.

Figure 27E:
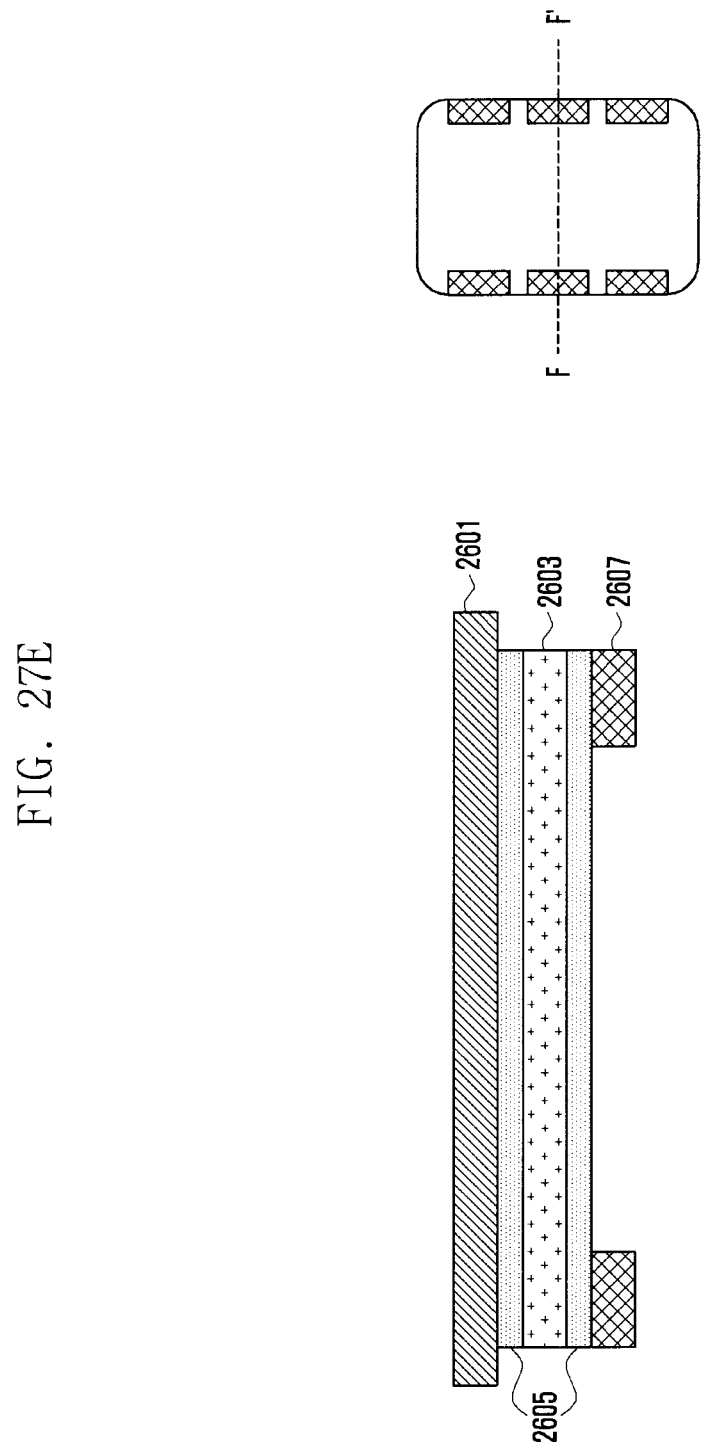

FIG. 27E is a cross-sectional view taken in a direction F-F' when viewed from a front surface of the display 703.

In FIG. 27E, in the display 703, the cover glass 2601, the display 2605, the touch sensor panel 2603, the display 2605, and the pressure sensor 2607 may be stacked in this order from an upper layer. The display 2605 may include a touch sensor panel 2603 therebetween. The pressure sensor 2607 may be disposed only in a partial area of the display 703.

Figure 27F:
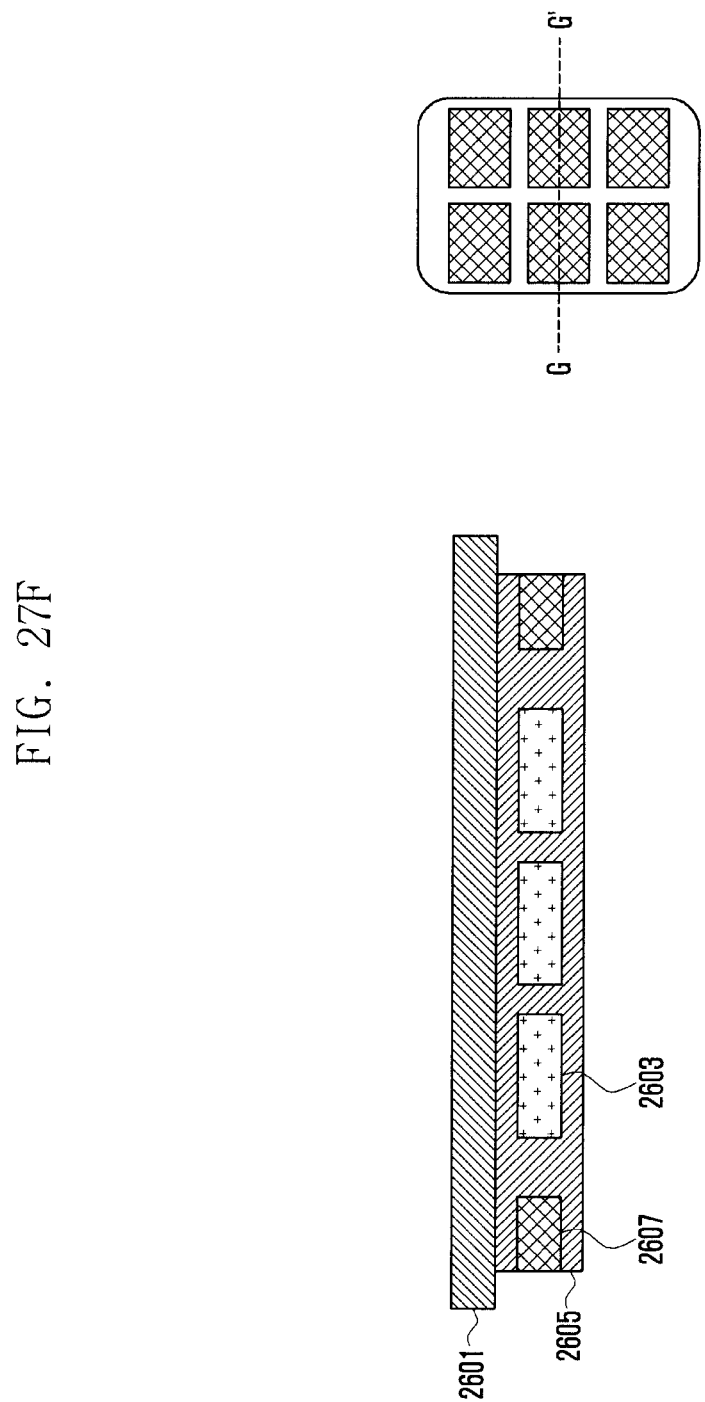

FIG. 27F is a cross-sectional view taken in a direction G-G' when viewed from a front surface of the display 703.

In FIG. 27F, in the display 703, at least one of the cover glass 2601, the display 2605, the touch sensor panel 2603, and the pressure sensor 2607 may be disposed from an upper layer, and the cover glass 2601, the display 2605, the touch sensor panel 2603 or the pressure sensor 2607, and the display 2605 may be stacked in this order. The display 2605 may include at least one of the touch sensor panel 2603 and the pressure sensor 2607 therebetween. The touch sensor panel 2603 and the pressure sensor 2607 may be disposed only in a partial area of the display 703.

Figure 28A:
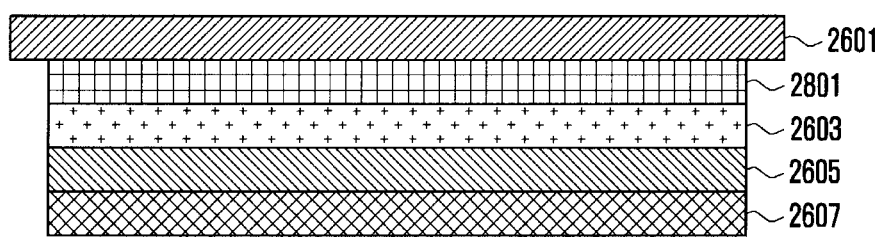
FIGS. 28A to 28G are cross-sectional views illustrating a display according to various embodiments of the present invention.

FIGS. 28A to 28G are cross-sectional views of a display 703 according to various embodiments of the present invention. In FIG. 28A, in the display 703, cover glass 2601, an antenna 2801 (e.g., a transparent antenna), a touch sensor panel 2603, a display 2605, and a pressure sensor 2607 may be stacked in this order from an upper layer.

Figure 28B:
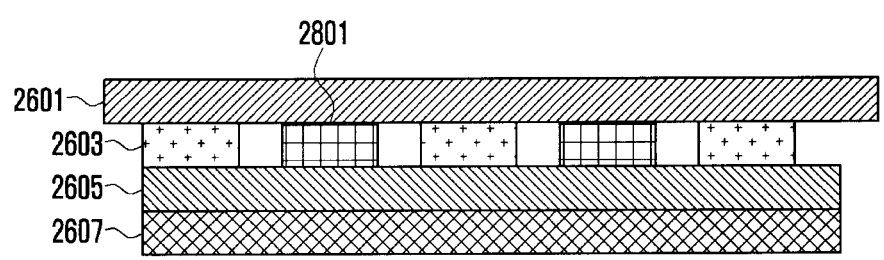

In FIG. 28B, in the display 703, at least one of the cover glass 2601, the antenna 2801 (e.g., a transparent antenna), and the touch sensor panel 2603 may be disposed from an upper layer, and the display 2605 and the pressure sensor 2607 may be stacked in this order. At least one of the antenna 2801 (e.g., a transparent antenna) and the touch sensor panel 2603 may be disposed to intersect between the cover glass 2601 and the display 2605.

Figure 28C:
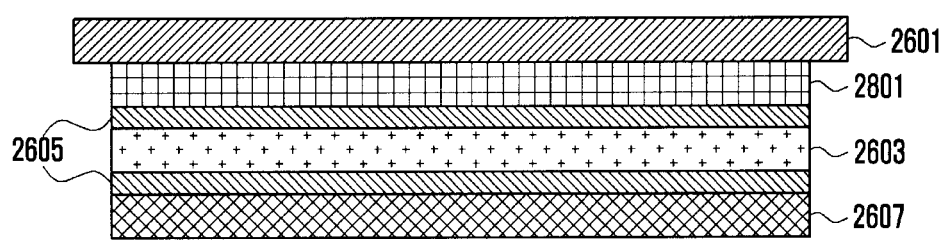

In FIG. 28C, in the display 703, the cover glass 2601, the antenna 2801 (e.g., a transparent antenna), the display 2605, the touch sensor panel 2603, the display 2605, and the pressure sensor 2607 may be stacked in this order from an upper layer. The antenna 2801 (e.g., a transparent antenna) may be disposed between the touch sensor panel 2603 and the cover glass 2601. The display 2605 may include a touch sensor panel 2603 therebetween. The touch sensor panel 2603 may be disposed between the display 2605.

Figure 28D:
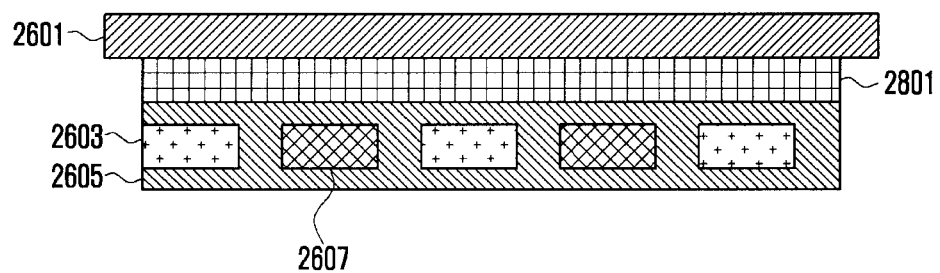

In FIG. 28D, in the display 703, the cover glass 2601, the antenna 2801 (e.g., a transparent antenna), and the display 2605 may be layered in this order from an upper layer, and the display 2605 may include at least one of the touch sensor panel 2603 and the pressure sensor 2607 therebetween. At least one of the touch sensor panel 2603 and the pressure sensor 2607 may be disposed between the display 2605. At least one of the touch sensor panel 2603 and the pressure sensor 2607 may be disposed to intersect between the display 2605.

Figure 28E:
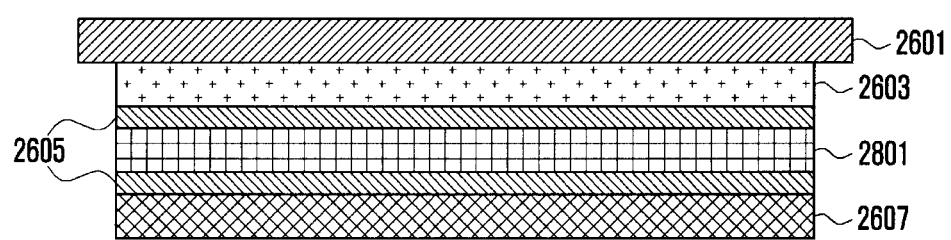

In FIG. 28E, in the display 703, the cover glass 2601, the touch sensor panel 2603, the display 2605, and the pressure sensor 2607 may be disposed in this order from an upper layer, and the display 2605 may include an antenna 2801 (e.g., a transparent antenna) therebetween. The antenna 2801 (e.g., a transparent antenna) may be disposed between the display 2605.

Figure 28F:
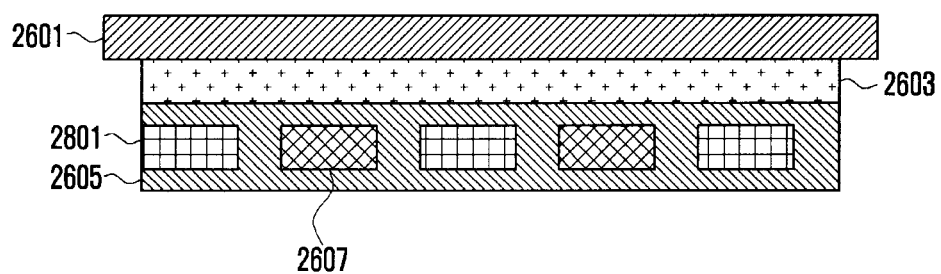

In FIG. 28F, in the display 703, the cover glass 2601, the touch sensor panel 2603, and the display 2605 may be disposed in this order from an upper layer, and the display 2605 may include at least one of the antenna 2801 (e.g., a transparent antenna) and the pressure sensor 2607 therebetween. At least one of the antenna 2801 (e.g., a transparent antenna) and the pressure sensor 2607 may be disposed between the display 2605. At least one of the antenna 2801 (e.g., a transparent antenna) and the pressure sensor 2607 may be disposed to intersect between the display 2605.

Figure 28G:
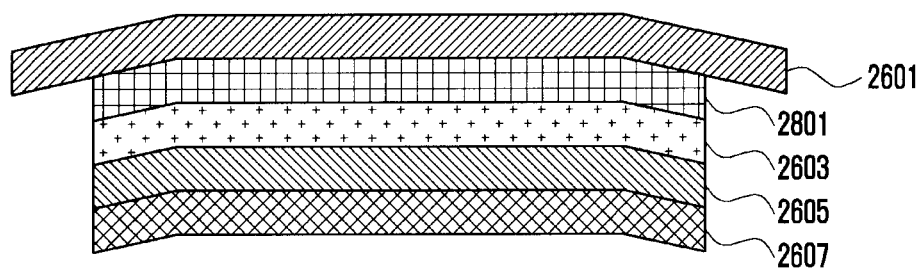

In FIG. 28G, in the display 703, the cover glass 2601, the antenna 2801 (e.g., a transparent antenna), the touch sensor panel 2603, the display 2605, and the pressure sensor 2607 may be stacked in this order from an upper layer, and both end portions of the display 703 may be bent.

Figure 29A:
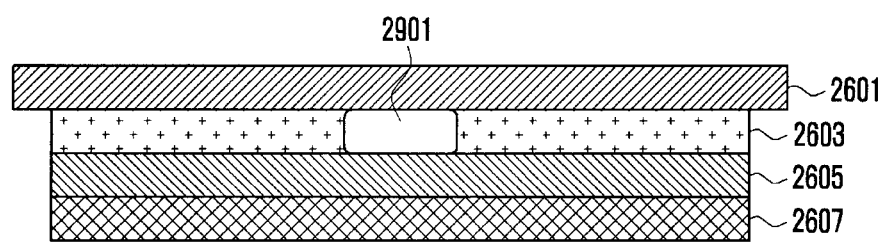
FIGS. 29A to 29I are diagrams illustrating a display according to various embodiments of the present invention.

FIGS. 29A to 29I are diagrams illustrating a display 703 according to various embodiments of the present invention. In FIG. 29A, in the display 703, the cover glass 2601, the antenna 2801 (e.g., a transparent antenna), the touch sensor panel 2603, the display 2605, and the pressure sensor 2607 may be stacked in this order from an upper layer. A fingerprint sensor 2901 may be included in at least a portion (e.g., the center) of the touch sensor panel 2603.

Figure 29B:
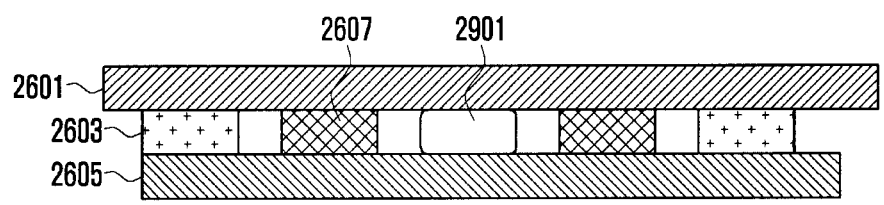

In FIG. 29B, in the display 703, at least one of the cover glass 2601, the touch sensor panel 2603, the fingerprint sensor 2901, and the pressure sensor 2607 may be disposed from an upper layer, and the cover glass 2601, the touch sensor panel 2603, the fingerprint sensor 2901 or the pressure sensor 2607, and the display 2605 may be stacked in this order. In FIG. 29B, at least one of the touch sensor panel 2603 and the pressure sensors 2607 may be disposed to intersect between the cover glass 2601 and the display 2605. At least one of the touch sensor panel 2603, the fingerprint sensor 2901, and the pressure sensor 2607 may be disposed between the cover glass 2601 and the display 2605.

Figure 29C:
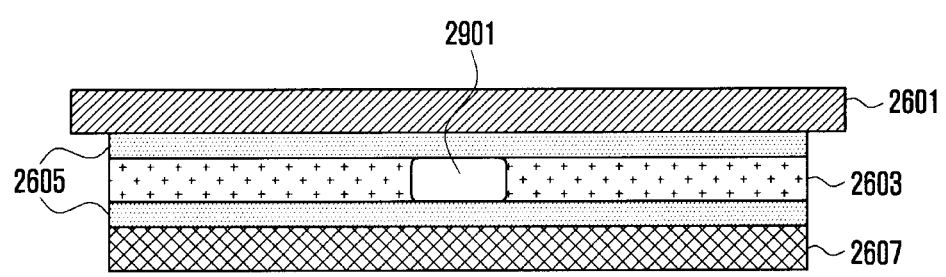

In FIG. 29C, in the display 703, the cover glass 2601, the display 2605, the touch sensor panel 2603, the display 2605, and the pressure sensor 2607 may be stacked in this order from an upper layer. The display 2605 may include at least one of the touch sensor panel 2603 and the fingerprint sensor 2901 therebetween. At least one of the touch sensor panel 2603 and the fingerprint sensor 2901 may be disposed between the display 2605.

Figure 29D:
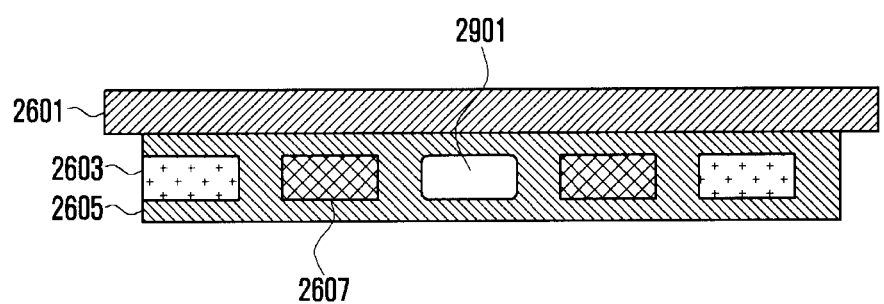

In FIG. 29D, in the display 703, the cover glass 2601 and the display 2605 may be stacked in this order from an upper layer. In FIG. 29D, at least one of the touch sensor panel 2603, the fingerprint sensor 2901, and the pressure sensor 2607 may be disposed between the display 2605.

Figure 29E:
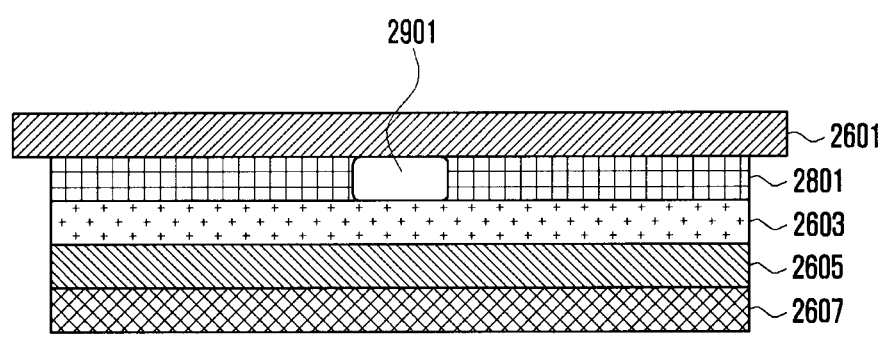

In FIG. 29E, in the display 703, the cover glass 2601, the antenna 2801 (e.g., a transparent antenna), the touch sensor panel 2603, the display 2605, and the pressure sensor 2607 may be stacked in this order from an upper layer. At least a portion (e.g., the center) of the touch sensor panel 2603 may include a fingerprint sensor 2901.

Figure 29F:
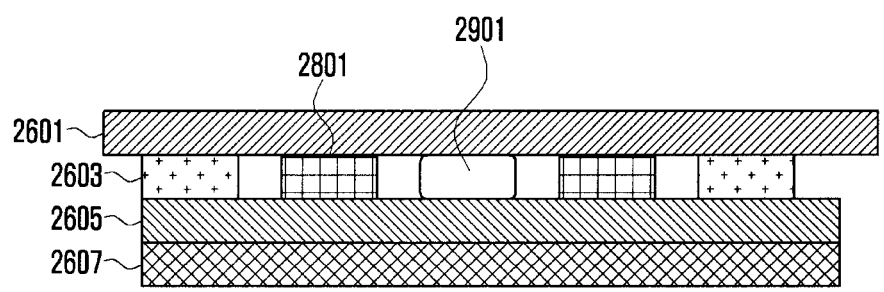

In FIG. 29F, in the display 703, at least one of the cover glass 2601, the antenna 2801 (e.g., a transparent antenna), and the touch sensor panel 2603 may be disposed from an upper layer, and the display 2605 and the pressure sensor 2607 may be stacked in this order. At least one of the antenna 2801 (e.g., a transparent antenna), the fingerprint sensor 2901, and the touch sensor panel 2603 may be disposed between the cover glass 2601 and the display 2605.

Figure 29G:
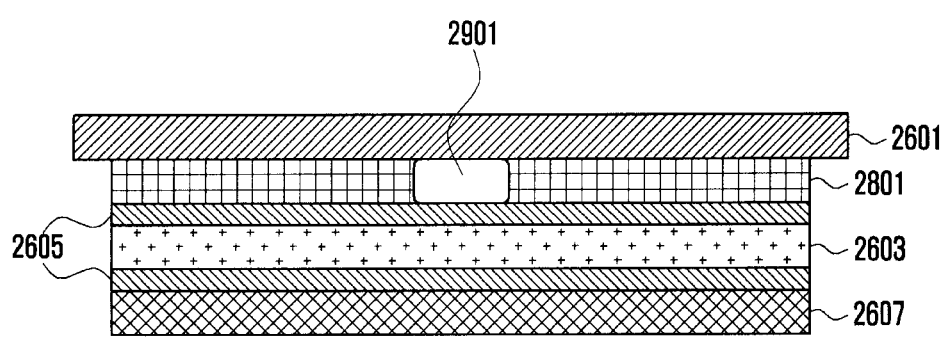

In FIG. 29G, in the display 703, the cover glass 2601, the antenna 2801 (e.g., a transparent antenna), the display 2605, the touch sensor panel 2603, the display 2605, and the pressure sensor 2607 may be stacked in this order from an upper layer. The antenna 2801 (e.g., a transparent antenna) may be disposed between the touch sensor panel 2603 and the cover glass 2601. The fingerprint sensor 2901 may be disposed in a partial area of the antenna 2801 (e.g., a transparent antenna). The display 2605 may include a touch sensor panel 2603 therebetween. The touch sensor panel 2603 may be disposed between the display 2605.

Figure 29H:
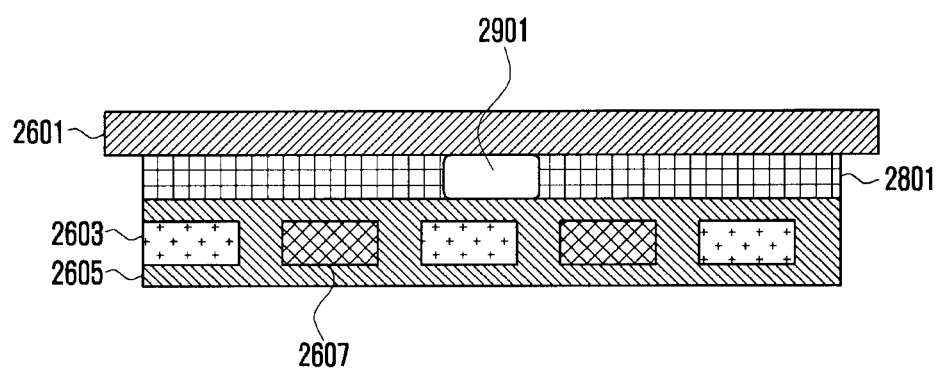
Figure 29I:
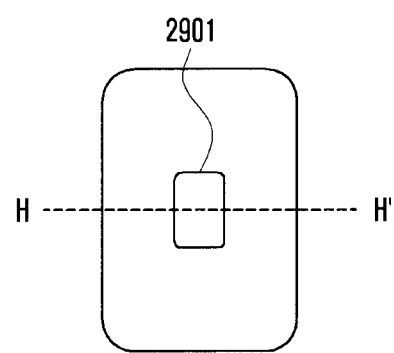

In FIG. 29H, in the display 703, the cover glass 2601, the antenna 2801 (e.g., a transparent antenna), and the display 2605 may be disposed in this order from an upper layer, and the display 2605 may include at least one of the touch sensor panel 2603 and the pressure sensor 2607 therebetween. At least one of the touch sensor panel 2603 and the pressure sensor 2607 may be disposed between the display 2605. At least one of the touch sensor panel 2603 and the pressure sensor 2607 may be disposed to intersect between the display 2605. The fingerprint sensor 2901 may be disposed at a partial area of the antenna 2801 (e.g., a transparent antenna). FIGS. 29A to 29H are cross-sectional views taken in a direction H-H' when viewed from a front surface of the display 703.

FIGS. 30A to 30F are diagrams illustrating a display 703 and an electronic device 101 according to various embodiments of the present invention.

Figure 30A:
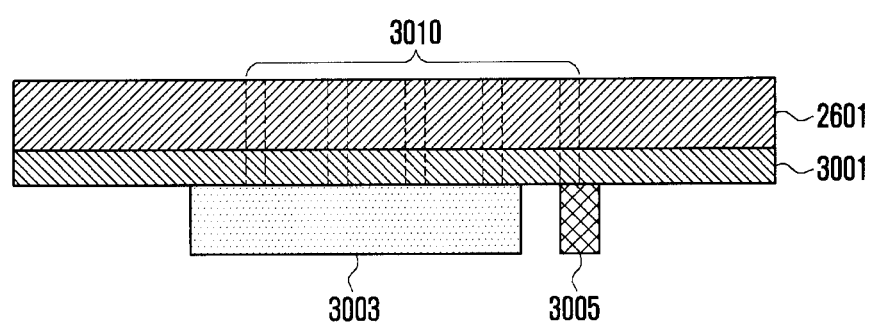
FIGS. 30A to 30F are diagrams illustrating a display and an electronic device according to various embodiments of the present invention.

In FIG. 30A, in the display 703, cover glass 2601, a display black mask (BM) area 3001, and receiver module 3003/microphone 3005 may be stacked in this order from an upper layer.

In the cover glass 2601 and the display BM area 3001, in order to input/output to the receiver module 3003/microphone 3005, at least one micro hole 3010 may be penetrated in a direction of the receiver module 3003/microphone 3005.

Figure 30B:
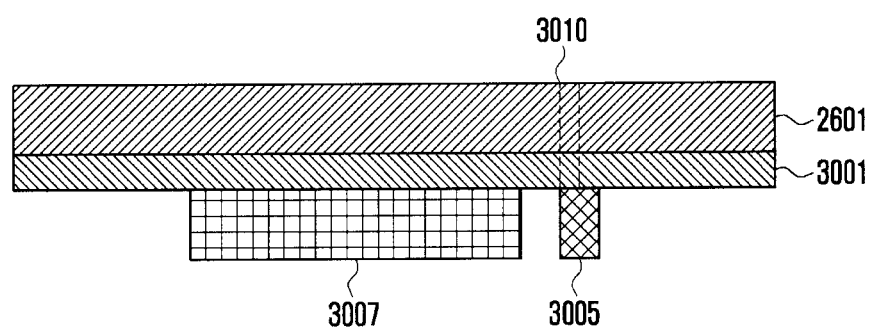

In FIG. 30B, in the display 703, the cover glass 2601, the display BM area 3001, and the piezo speaker 3007/microphone 3005 may be stacked in this order from an upper layer. In the cover glass 2601 and the display BM area 3001, in order to input to the microphone 3005, at least one micro hole 3010 may be penetrated in a direction of the microphone 3005.

Figure 30C:
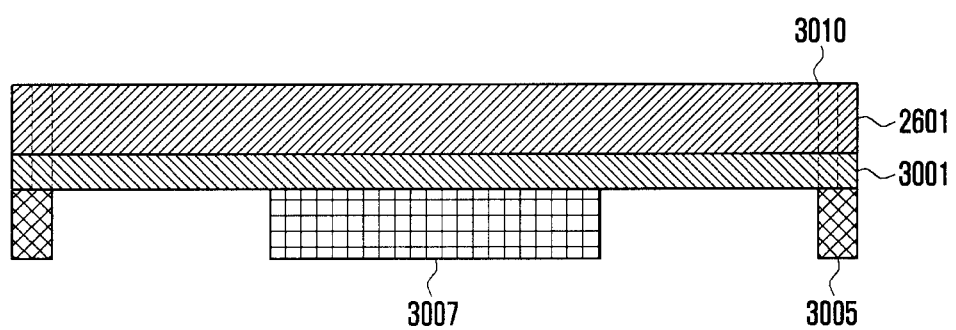

In FIG. 30C, in the display 703, the cover glass 2601, the display BM area 3001, and the piezo speaker 3007/at least one microphone 3005 may be stacked in this order from an upper layer. In the cover glass 2601 or the display BM area 3001, in order to input to at least one microphone 3005, at least one micro hole 3010 may be penetrated in a direction of the microphone 3005.

Figure 30D:
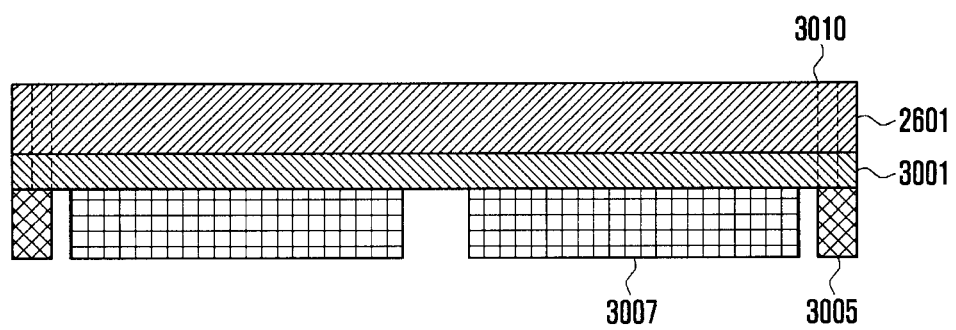

In FIG. 30D, in the display 703, the cover glass 2601, the display BM area 3001, and at least one piezo speaker 3007/at least one microphone 3005 may be stacked in this order from an upper layer. In the cover glass 2601 or the display BM area 3001, in order to input to at least one microphone 3005, at least one micro hole 3010 may be penetrated in a direction of the microphone 3005.

Figure 30E:
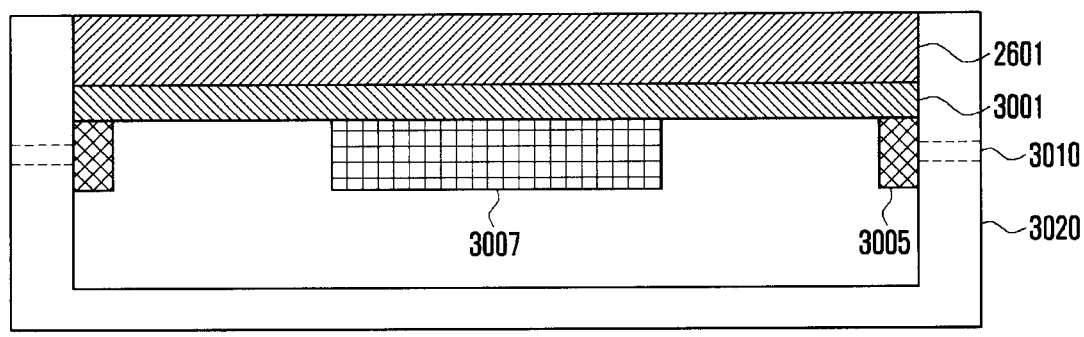
Figure 30F:
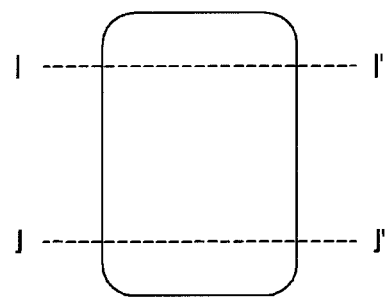

In FIG. 30E, in the display 703, the cover glass 2601, the display BM area 3001, the piezo speaker 3007/at least one microphone 3005 may be stacked in this order from an upper layer. In the housing 3020, in order to input to the at least one microphone 3005, at least one micro hole 3010 may be penetrated in a direction of the microphone 3005.

FIGS. 30A to 30E are cross-sectional views taken in a direction I-I' or J-J' when viewed from a front surface of the display 703 or the electronic device 101.

Figure 31:
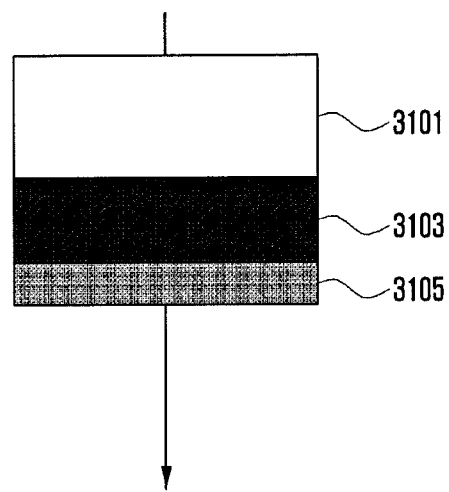
FIG. 31 is a diagram illustrating a structure of a piezoelectric speaker according to various embodiments of the present invention.

FIG. 31 is a diagram illustrating a structure of a piezoelectric speaker according to various embodiments of the present invention. The piezoelectric speaker may include an electrode 3101, piezoelectric element 3103, and final matching layer 3105. When power is transferred to the piezoelectric element 3103 through the electrode 3101, the piezoelectric speaker changes an electrical signal to a vibration signal to vibrate air using the final matching layer 3105 that contacts with the piezoelectric element 3103 as a transducer and to convert a vibration motion to a voice signal.

In an electronic device (e.g., the electronic device 101) including a full front display, because the display (e.g., the display 160) occupies an entire front surface, a receiver for transferring communication voice signals to a user should be removed and a case of having a holeless structure in a front display direction may be a normal situation. In this case, by vibrating some of the terminal configuration units using a piezoelectric element instead of mounting the receiver at a front surface, communication voice signals may be transferred using a transducer type. The piezoelectric element changes electric signals to vibration signals to vibrate air using an object that contacts with the piezoelectric element as the transducer and to convert a vibration motion to a voice signal. The piezoelectric element in an electronic device including a full front display may be located at a rear surface or a side surface of the display. Further, the piezoelectric element may indirectly transfer a vibration in addition to a case directly bonded to the transducer.

A computer readable recording medium may include a hard disk, floppy disk, magnetic medium (e.g., magnetic tape), optical media (e.g., compact disc read only memory (CD-ROM), digital versatile disc (DVD)), magneto-optical media (e.g., floptical disk), and a hardware device (e.g., read only memory (ROM), random access memory (RAM), or flash memory). Further, a program command may include a high-level language code that may be executed by a computer using an interpreter as well as a machine language code generated by a compiler. In order to perform the operations of various embodiments, the above-described hardware device may be configured to operate as at least one software module and vice versa.

A module or a programming module according to various embodiments may include at least one of the foregoing elements, may omit some elements, or may further include additional other elements. Operations performed by a module, a programming module, or another constituent element according to various embodiments may be executed with a sequential, parallel, repeated, or heuristic method. Further, some operations may be executed in different orders, may be omitted, or may add other operations. Embodiments disclosed in this document are suggested for description and understanding of technology contents and do not limit the scope of technology described in this document. Therefore, it should be analyzed that a range of this document includes all changes or various other embodiments based on the scope and spirit of this document.

The invention claimed is:
1. An electronic device, comprising:
   a housing comprising a first plate advancing in a first direction and a second plate advancing in a second direction opposite to the first direction and configured to form a space between the first plate and the second plate;
   a side member configured to enclose at least a portion of the space;
   a display disposed within the housing and exposed through the first plate;
   a printed circuit board (PCB) disposed within the housing and disposed between the display and the second plate; and
   a communication module disposed within the housing and coupled to the PCB,
   wherein the side member comprises:
      a first conductive member extended to a periphery of the space;
      a second conductive member extended to a periphery of the space in parallel to the first conductive member, wherein the first conductive member is spaced apart from the second conductive member, the second conductive member is adjacent to the second plate rather than the first conductive member, and at least a portion of the second conductive member is electrically connected to the communication module; and a first insulating member extended to a periphery of the space in parallel to the first conductive member and disposed between the first conductive member and the second conductive member.

2. The electronic device of claim 1, wherein the second conductive member comprises a first portion and a second portion separated from the first portion in a third direction perpendicular to the first direction, and wherein the electronic device further comprises a second insulating member configured to fill a gap between the first portion and the second portion.

3. The electronic device of claim 2, wherein the second conductive member comprises a third portion separated from the first portion in a third direction, wherein the first portion is disposed at an intermediate portion between the second portion and the third portion, and wherein the electronic device further comprises a third insulating member configured to fill a gap between the first portion and the third portion.

4. The electronic device of claim 3, wherein the first conductive member comprises a first portion, a second portion, and a three portion, and wherein the first portion, the second portion, and the third portion of the first conductive member are extended parallel to the first portion, the second portion, and the third portion, respectively, of the second conductive member.

5. The electronic device of claim 4, wherein the second insulating member fills a gap between the first portion and the second portion of the first conductive member, and wherein the third insulating member fills a gap between the first portion and the third portion of the first conductive member.

6. The electronic device of claim 1, wherein the first conductive member is electrically separated from the PCB.

7. The electronic device of claim 1, wherein the PCB further comprises a fill-cut area electrically connected to the second conductive member, wherein the fill-cut area comprises:

a coupling portion electrically connected to the second conductive member;

a matching circuit for impedance matching of the PCB and the second conductive member; and a signal line configured to electrically connect the matching circuit and the coupling portion.

8. The electronic device of claim 7, wherein the fill-cut area further comprises a tuner circuit configured to adjust a resonance frequency of the second conductive member.

9. The electronic device of claim 1, wherein at least one of the first conductive member and the second conductive member is connected to a passive element connected to a ground.

10. The electronic device of claim 1, wherein in the first insulating member, a portion disposed inside the electronic device has an area larger than that of a portion disposed outside the electronic device.

11. The electronic device of claim 1, further comprising a screw configured to couple by penetrating the first conductive member, and the second conductive member, and the first insulating member.

12. The electronic device of claim 1, further comprising a material configured to couple by welding the first conductive member, the second conductive member, and the first insulating member.

* * * * *